United States Patent
Ballantine et al.

(10) Patent No.: US 11,150,208 B2
(45) Date of Patent: Oct. 19, 2021

(54) ELECTROCHEMICAL IMPEDANCE SPECTROSCOPY ANALYZER ("EISA") CHIP FOR A MICROELECTROMECHANICAL SYSTEM (MEMS)

(71) Applicant: BLOOM ENERGY CORPORATION, San Jose, CA (US)

(72) Inventors: Arne Ballantine, Palo Alto, CA (US); John Cronin, Jericho, VT (US); Joseph Bodkin, Williston, VT (US)

(73) Assignee: BLOOM ENERGY CORPORATION, San Jose, CA (US)

( * ) Notice: Subject to any disclaimer, the term of this patent is extended or adjusted under 35 U.S.C. 154(b) by 269 days.

(21) Appl. No.: 16/363,361

(22) Filed: Mar. 25, 2019

(65) Prior Publication Data
US 2019/0310215 A1   Oct. 10, 2019

Related U.S. Application Data

(60) Provisional application No. 62/647,340, filed on Mar. 23, 2018.

(51) Int. Cl.
*G01N 27/02* (2006.01)
*G01R 31/389* (2019.01)
*G01N 27/12* (2006.01)

(52) U.S. Cl.
CPC ......... *G01N 27/026* (2013.01); *G01N 27/128* (2013.01); *G01R 31/389* (2019.01)

(58) Field of Classification Search
CPC ... G01N 27/026; G01N 27/128; G01R 31/389
See application file for complete search history.

(56) References Cited

U.S. PATENT DOCUMENTS

| | | | |
|---|---|---|---|
| 9,416,320 B2 | 10/2016 | Ballantine et al. | |
| 9,461,319 B2 | 10/2016 | Sudhan et al. | |
| 10,608,443 B2 * | 3/2020 | Thompson | G05B 19/0428 |
| 10,649,512 B2 * | 5/2020 | Ou Yang | G06F 1/26 |
| 2015/0228990 A1 | 8/2015 | Ballantine et al. | |
| 2015/0244011 A1 | 8/2015 | Sudhan et al. | |
| 2017/0077535 A1 | 3/2017 | Sudhan et al. | |
| 2018/0181171 A1 * | 6/2018 | Jang | G06F 1/206 |

OTHER PUBLICATIONS

U.S. Appl. No. 16/363,160, filed Mar. 25, 2019, Bloom Energy Corporation.
U.S. Appl. No. 16/363,214, filed Mar. 25, 2019, Bloom Energy Corporation.
U.S. Appl. No. 16/363,435, filed Mar. 25, 2019, Bloom Energy Corporation.
U.S. Appl. No. 16/363,262, filed Mar. 25, 2019, Bloom Energy Corp.

* cited by examiner

*Primary Examiner* — Reena Aurora
(74) *Attorney, Agent, or Firm* — The Marbury Law Group PLLC

(57) ABSTRACT

Various embodiments may provide an electrochemical impedance spectroscopy analyzer (EISA) chip for a microelectromechanical system (MEMS). In various embodiments, the EISA chip may perform an electrochemical impedance spectroscopy (EIS) test on a battery and may gather sensor data associated with a battery from sensors on the MEMS.

16 Claims, 17 Drawing Sheets

706

| Command Database | | |
|---|---|---|
| Battery Type | Battery ID | Commands |
| Li-ion, MNC | LiXXXX | Apply input for 2 sec and take output for 3 sec |
| Li-ion, MNC | LiXXXX | Apply input for 2 sec and take output for 3 sec |
| Pb Acid | PbAAA | Apply input for 12 sec and take output for 20 sec |
| Li-ion, LiFePO | LiUUUU | Apply input for 5sec and take output for 10 sec |
| Ni-Cd | NI1233 | Apply input for 2 sec and take output for 2 sec |

| Sensor | Range |
|---|---|
| Sensor 1 – Thermal Sensor | -3 degrees to +5 degrees |
| Sensor 2 – Chemical Sensors | Concentration < 35 ppm |
| Sensor N – Internal Sensor | Internal resistance < 23 ohm |

ELECTROCHEMICAL IMPEDANCE SPECTROSCOPY ANALYZER ("EISA") CHIP FOR A MICROELECTROMECHANICAL SYSTEM (MEMS)

This application claims the benefit of priority to U.S. Provisional Patent Application Ser. No. 62/647,340 filed Mar. 23, 2018, entitled "Micro-Sampler for a Sensor", the contents of which are incorporated herein by reference in their entirety

BACKGROUND

Batteries may be susceptible to degradation from charging and discharging cycles because of the effects these factors may have on the internal chemistry of batteries. Battery degradation from charge and discharge cycles may be caused by adhesion of oxidized particles to an anode and a cathode reducing a surface area for reacting with an electrolyte, reducing an amount of the electrolyte in the battery, and increase an internal resistance of the battery. Battery degradation may result in a reduced power storage capacity, a reduced voltage output, and an increased self-discharge rate. These degradations of a battery's performance may also reduce a useful life of a battery.

SUMMARY

The systems, methods, and devices of the various embodiments enable electrochemical impedance spectroscopy ("EIS") to be performed on batteries. Various embodiments include an electrochemical impedance spectroscopy analyzer ("EISA") chip for a microelectromechanical system (MEMS). In various embodiments, the EISA chip may perform an EIS test on a battery and may gather sensor data associated with a battery from sensors on the MEMS. The sensor data may be compared to sensor ranges. In response to determining that the sensor data is outside of the sensor ranges, the EIS response waveform from the EIS testing and the sensor data may be used to determine a state of the battery and a recommendation based on that state. In various embodiments, the EISA chip may perform an EIS test on a battery in response to a sensor being triggered that draws current from the battery. The EISA chip may save data resulting from the EIS test and the data resulting from the EIS test may be used to determine how the battery is being used by the sensor. The determination of how the battery is being used by the sensor may be used in various manners. For example, the determination of how the battery is being used by the sensor may be indicated to a user, may be used to adjust the battery settings, may be used to adjust the sensor settings, and/or may be used to adjust user device settings.

Various embodiments may provide systems and methods for EIS testing of a battery. Various embodiments may include performing an EIS test on the battery by an EISA chip of a MEMS connected to the battery, storing a response waveform result from running the EIS test on the battery in a data entry of an EISA chip memory MEMS database of the EISA chip, receiving a first type of sensor data associated with the battery from a first senor, storing the first type of sensor data associated with the battery in the data entry of the EISA chip memory MEMS database, determining whether the first type of sensor data in the data entry of the EISA chip memory MEMS database is within a range indicated in an EISA chip memory sensor range database of the EISA chip, and sending the data entry of the EISA chip memory MEMS database to a device processor in response to determining that the first type of sensor data in the data entry of the EISA chip memory MEMS database is not within the range indicated in the EISA chip memory sensor range database. Various embodiments may further include receiving the data entry of the EISA chip memory MEMS database comparing the received data entry to a device response database to identify a matching data entry, and displaying a recommendation correlated to the matching data entry from the device response database in a graphical user interface (GUI) of the device. In various embodiments, the EIS test on the battery may be performed in response to a device sensor being triggered.

DESCRIPTION OF THE DRAWINGS

The accompanying drawings, which are incorporated herein and constitute part of this specification, illustrate example embodiments of various embodiments, and together with the general description given above and the detailed description given below, serve to explain the features of the claims.

FIG. 9 is a table illustrating an example EISA chip memory commands database according to various embodiments.

FIG. 11 is a table illustrating an example EISA chip memory sensor range database.

DETAILED DESCRIPTION

Figure 1:
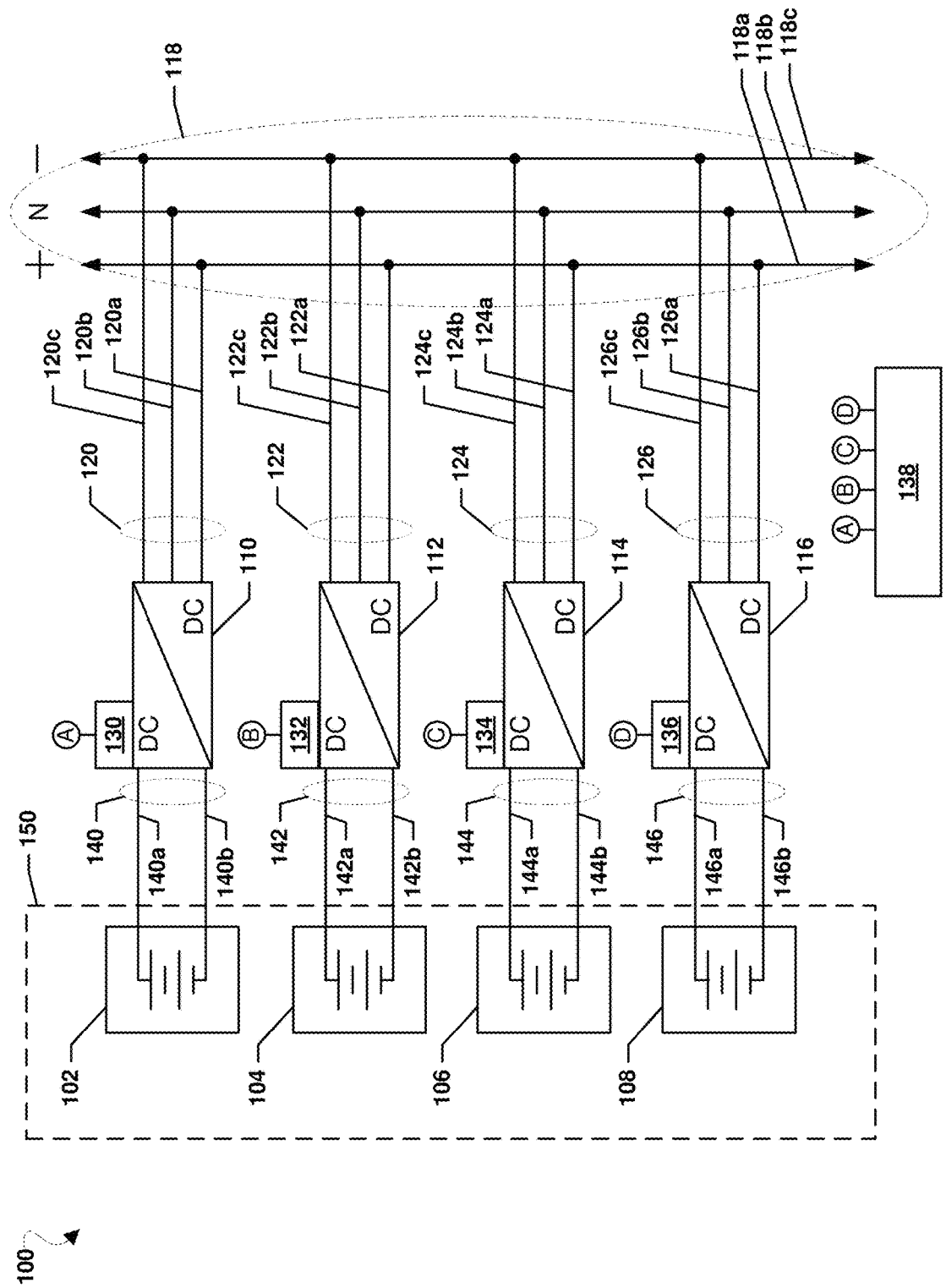
FIG. 1 is a block diagram illustrating a system according to an embodiment.

Various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims.

Many types of batteries are susceptible to degradation from charging and discharging cycles, heat and cold exposure, and aging because of the effects these factors may have on the internal chemistry of batteries. For example, any one or combination of the battery degradation factors may result in deposits of oxidized particles of an electrolyte adhering to an anode and a cathode of a battery. The adhesion of the oxidized particles to the anode and the cathode may reduce a surface area of the anode and the cathode for reacting with the electrolyte, reduce an amount of electrolyte in the battery, and increase the internal resistance of the battery. Battery degradation may result in a reduced power storage capacity, a reduced voltage output, and an increased self-discharge rate. These degradations of a battery's performance may also reduce a useful life of a battery. Sensors on a device being triggered inefficiently may be one source of battery degradation. For example, sensors triggering on and off may result in inefficient discharging cycles of the battery. In some embodiments, sensor triggering and the corresponding battery discharging may be managed to improve efficiency, performance, and/or longevity of batteries. In some embodiments, how a battery is being used by a sensor may be determined. In some embodiments, the determination of how the battery is being used by the sensor may be used to adjust how much current is used to activate the sensor thereby improving the system including the battery and the sensor and/or improving performance of the system. In some embodiments, the determination of how the battery is being used by the sensor may indicate user usage habits of the system including the battery and the sensor.

The systems, methods, and devices of various embodiments enable electrochemical impedance spectroscopy (EIS) (also called AC impedance spectroscopy) to be performed on batteries by power electronics connecting the batteries in parallel to a common load and/or bus. The term "battery" may be used interchangeably herein to refer to a battery pack, which may include any number batteries, a battery, which may include any number of battery cells, and/or a battery cell of a battery. A battery may include any rechargeable wet cell battery, rechargeable dry cell battery, and/or rechargeable solid state battery.

EIS enables the overall impedance of a battery to be determined by applying a test waveform of varying voltage, varying current, or varying voltage and current to the battery and measuring a voltage or current across the battery at varying sampling frequencies to determine a response waveform of varying voltage, varying current, or varying voltage and current. A test waveform of varying voltage, varying current, or varying voltage and current may be selected to achieve the varying sampling frequencies, such as a waveform with voltage/current oscillations of approximately 1 Hz, may be generated on a line connected to the battery. Such a voltage/current waveform may be generated by rapid switching of the line to load and unload the battery, thereby injecting the test waveform into the battery. The test waveform may be a sine wave or other type pattern of variation with time of voltage, current or voltage and current, and may be selected to achieve desired sampling frequencies for a particular EIS test. A voltage or current of the battery and a resulting phase angle may be measured or determined at a sampling frequency to obtain a response waveform, and the response waveform or the resulting measurements/determinations processed using EIS to determine battery impedances. During EIS testing, a number of different voltage/current waveforms may be applied to the battery to obtain different response waveforms, such as impedance measured at various applied waveform frequencies. For ease of reference, a waveform of varying voltage, varying current, or varying voltage and current applied to the battery is referred to herein and in the claims as a "test waveform" to encompass applied voltage, current and voltage/current waveforms. For ease of reference, measurements of voltage, current or voltage and current across the battery while a test waveform is applied are referred generally and collectively in the specification and the claims as a "response waveform." By comparing the applied test waveform to the measured or determined response waveform, an impedance response of the battery may be determined at the frequency of the applied test waveform.

Results of the EIS procedure (e.g., the impedance at varying frequencies) may be graphically represented using a Nyquist plot or Bode plot and characteristics of the battery may be determined based on the impedance response of the battery. By comparing the impedance response of the battery being measured to known signatures of impedance responses of batteries with known characteristics, the characteristics of the measured battery may be identified. Characteristics of the battery that may be determined based at least in part on the impedance response include charge conditions (e.g., state of charge), anode conditions, and cathode conditions. Based on the determined characteristics of the battery, a charging operation may be conducted and/or a charging rate of the battery may be adjusted. Additionally, determined characteristics of the battery may be compared to a failure threshold, and when the characteristics exceed the failure threshold, a failure mode of the battery may be indicated, such as buildup of non-conductive compounds on the anode or cathode, dendritic breakdown of the electrolyte, etc.

In an embodiment, the power electronics connected to each battery of a group of two or more batteries may compensate for any ripple generated during EIS such that no ripple or a reduced ripple is realized at the common load and/or bus. As one power electronics injects the test waveform into its respective battery, a resulting ripple from that power electronics may be applied to the load and/or bus. To counteract this ripple from the power electronics performing EIS monitoring, an offsetting (or canceling) ripple or ripples may be generated by one or more of the other power electronics. To generate the offsetting (or canceling) ripple or ripples one or more of the other power electronics not presently performing EIS monitoring may inject an offset waveform toward their respective battery resulting in an offsetting ripple being applied to the common load and/or bus connected in parallel to the batteries. The sum of the ripple from the power electronics performing EIS monitoring and the offsetting ripple or ripples from the one or more other power electronics may be a DC output resulting in little or no ripple at the load and/or common bus.

In another embodiment, other devices connected to the common load and/or bus may compensate for any ripple generated during EIS such that no ripple or a reduced ripple is realized at the common load and/or bus. As discussed above, as one power electronics injects the test waveform into its respective battery, a resulting ripple from that power electronics may be applied to the load and/or bus. To counteract this ripple from the power electronics performing EIS monitoring, an offsetting (or canceling) ripple or ripples may be generated by one or more other device, such as a waveform generator, and injected into the common load and/or bus. To generate the offsetting (or canceling) ripple or ripples one or more other device may apply an offset ripple to the common load and/or bus connected in parallel to the batteries. The sum of the ripple from the power electronics performing EIS monitoring and the offsetting ripple or ripples applied by the other device may be a DC output resulting in no ripple at the load and/or common bus.

In an embodiment, during EIS monitoring the impedance of a battery may be determined as the polar form voltage of the battery over the polar form current of the battery. This may enable a Fourier series calculation to be used to allow for analysis of an imperfect sinusoidal ripple at the fundamental frequency without needing to calculate a full Fast Fourier Transform. This may increase the accuracy of the impedance calculation and decrease the processing time required to determine an impedance response in comparison to impedance determinations made using a full Fast Fourier Transform.

In an embodiment, energy storage devices may be included on the power electronics connected to each battery. Energy storage devices may be any type energy storage devices, such as capacitors, supercapacitors, batteries, etc. In various embodiments, the energy storage devices may be on the output, the input, or windings of the transformer of the power electronics to store ripple energy and discharge the ripple energy out of phase. The energy storage device may reduce the ripple current, or eliminate the ripple current, passing to the bus. The ability to reduce and/or eliminate the ripple current resulting from EIS testing may enable EIS testing using test waveforms with higher frequencies than may be used without the energy storage devices. For example, test waveforms with frequencies at or above 400 Hz may be used, greatly extending the bandwidth of the power electronics to create and analyze test waveforms. Without the energy storage devices, the bandwidth of the test waveform frequencies may be practically limited to frequencies less than the switching frequency of the power electronics. With the energy storage devices, the bandwidth of the test waveform frequencies may extend to frequencies greater than the switching frequency of the power electronics.

FIG. 1 is a block diagram of a system 100 according to an embodiment. The system 100 may include any number of batteries 102, 104, 106, and 108. For example, the batteries 102, 104, 106, and 108 may each be batteries that may constitute a portion of a power module 150. Each battery 102, 104, 106, and 108 may be electrically connected via a respective input connection 140, 142, 144, and 146 to a respective one of power electronics 110, 112, 114, and 116. Each input connection 140, 142, 144, and 146 may comprise a respective positive input connection 140a, 142a, 144a, and 146a as well as a respective negative input connection 140b, 142b, 144b, and 146b. In operation, the batteries 102, 104, 106, and 108 may output DC voltages to their respective power electronics 110, 112, 114, and 116 via their respective input connections 140, 142, 144, and 146.

The power electronics 110, 112, 114, and 116 may be DC to DC converters. The power electronics 110, 112, 114, and 116 may be each include controllers 130, 132, 134, and 136, respectively, each connected, wired or wirelessly, to a central controller 138. The controllers 130, 132, 134, and 136 may be processors configured with processor-executable instructions to perform operations to control their respective power electronics 110, 112, 114, and 116, and the controller 138 may be a processor configured with processor-executable instructions to perform operations to exchange data with and control the operations of power electronics 110, 112, 114, and 116 via their respective controllers 130, 132, 134, and 136. Via the connections A, B, C, and D between the controllers 130, 132, 134, 136 connected to the power electronics 110, 112, 114, and 116 and the controller 138, the controller 138 may be effectively connected to the power electronics 110, 112, 114, and 116 and control the operations of the power electronics 110, 112, 114, and 116.

The power electronics 110, 112, 114, and 116 may be connected in parallel to a DC bus 118 by their respective output connections 120, 122, 124, and 126. In an embodiment, the DC bus 118 may be a three phase bus comprised of a positive line 118a, a neutral line 118b, and a negative line 118c, and the respective output connections 120, 122, 124, and 126 may include respective positive output connections 120a, 122a, 124a, and 126a, respective neutral output connections 120b, 122b, 124b, and 126b, and respective negative output connections 120c, 122c, 124c, and 126c. In operation, the power electronics 110, 112, 114, and 116 may output DC voltages to the bus 118 via their respective output connections 120, 122, 124, and 126. In an embodiment, power electronics 110, 112, 114, and 116 may be three phase converters configured to receive positive and negative DC inputs from their respective batteries 102, 104, 106, and 108 and output positive DC, negative DC, and neutral outputs to the bus 118 via their respective positive output connections 120a, 122a, 124a, and 126a, respective neutral output connections 120b, 122b, 124b, and 126b, and respective negative output connections 120c, 122c, 124c, and 126c. In an alternative embodiment, power electronics 110, 112, 114, and 116 may each be comprised of dual two-phase converters. The positive output of the first of the two-phase converters may be connected to the positive line 118a of the bus 118 and the negative output of the second of the two-phase converters may be connected to the negative line 118c of the bus 118. The negative output of the first of the two-phase converters and the positive output of the second of the two-phase converters may be connected together to the neutral line 118b of the bus 118.

In an embodiment, the power electronics 110, 112, 114, and 116 may each be configured to perform EIS monitoring of their respective battery 102, 104, 106, and 108. The controller 138 may select a test waveform for use in EIS monitoring for one of the batteries 102, 104, 106, or 108, and may control that power electronics 110, 112, 114, or 116 of that battery 102, 104, 106, or 108 to inject the selected test waveform onto the respective input connection 140, 142, 144, or 146. For example, the controller 138 may send an indication of the selected test waveform to the controller 130 of power electronics 110 to cause opening and closing of a switch at the power electronics 110 to generate the selected test waveform via pulse width modulation on the input connection 140 of connected to the battery 102. The power electronics 110, 112, 114, or 116 injecting the test waveform may be configured to monitor the resulting impedance response of its respective battery 102, 104, 106, or 108, and via its respective controller 130, 132, 134, or 136 may output an indication of the monitored impedance response to the controller 138. Continuing with the preceding example, power electronics 110 may monitor the impedance response on the input connection 140 to the battery 102 and the controller 130 may indicate the impedance response of battery 102 to the controller 138.

The controller 138 may use the impedance response determined by EIS monitoring of a battery 102, 104, 106, 108 to determine a characteristic of that battery 102, 104, 106, 108 and may adjust a setting of the system 100 based on the determined characteristic. For example, the controller 138 may determine the impedance response according to method 500 described further below with reference to FIG. 5. The controller 138 may compare the impedance response determined by EIS monitoring of a battery 102, 104, 106, 108, such as a plot of the impedance response and/or stored impedance values, to impedance responses stored in a memory, such as stored plots of impedance responses and/or stored impedance values, of similar batteries correlated with known characteristics. The controller 138 may compare the impedance response determined by EIS monitoring of a battery 102, 104, 106, 108 to the stored impedance responses in any manner to identify matches between the impedance responses determined by EIS monitoring of a battery 102, 104, 106, 108 and the stored impedance responses.

When the controller 138 determines a match (e.g., identically or within some predetermined variance value) between the impedance response determined by EIS monitoring of a battery 102, 104, 106, 108 and a stored impedance response, the controller 138 may determine the characteristic correlated with the stored impedance response to be the characteristic of the respective battery 102, 104, 106, 108. For example, EIS monitoring may enable determined characteristics of the batteries 102, 104, 106, or 108 to be compared to charge state characteristics to determine an amount of charge stored in the batteries or whether charging of the batteries is indicated, and a suitable charging operation may be scheduled or commenced. As another example, EIS monitoring may enable determined characteristics of the batteries 102, 104, 106, or 108 to be compared to a failure threshold, and when the characteristics exceed the failure threshold a failure mode of the battery 102, 104, 106, or 108 may be indicated or determined, such as cathode or anode degradation, dendritic degradation of the electrolyte, chemical breakdown of the electrolyte, etc. Based on an indicated or determined failure mode, a suitable response may be indicated or taken, such as adjusting charging and discharging usage of one or more batteries 102, 104, 106, or 108 to extend the useful life of the power assembly 150, adjusting a charging rate and/or a discharging rate to slow or limit further battery degradation, performing a maintenance cycle on one or more of the batteries 102, 104, 106, or 108 (e.g., a deep discharge followed by full recharge), isolating one of the batteries 102, 104, 106, or 108 to prevent failure, and/or indicating that one or more batteries 102, 104, 106, or 108 are reaching end of life and should be replaced.

When a test waveform is injected on an input connection 140, 142, 144, or 146 by a respective power electronics 110, 112, 114, or 116 to perform EIS monitoring, a ripple on the respective output connection 120, 122, 124, or 126 may occur. If unaccounted for, the resulting ripple from the power electronics 110, 112, 114, or 116 performing EIS monitoring may cause an undesired ripple on the DC bus 118. To prevent a ripple on the DC bus 118, the ripple from the power electronics 110, 112, 114, or 116 performing EIS monitoring may be offset or canceled by other ripples injected into the DC bus 118. In an embodiment, the other ripples may be generated by one or more of the other power electronics 110, 112, 114, or 116 not performing EIS monitoring. The ripples from one or more of the other power electronics 110, 112, 114, or 116 not performing EIS monitoring may be generated by controlling the one or more of the other power electronics 110, 112, 114, or 116 not performing EIS monitoring to inject an offset waveform into their respective input connections to their respective input connections 140, 142, 144, or 146. The offset waveform or waveforms may be selected by the controller 138 such that the ripples on the respective output connections 120, 122, 124, or 126 generated in response to injecting the offset waveform or waveforms cancels the ripple caused by the power electronics 110, 112, 114, or 116 performing EIS monitoring when the waveforms are summed at the DC bus 118. In another embodiment, ripples may be injected into output connections 120, 122, 124, or 126 from devices other than the power electronics 110, 112, 114, or 116 to cancel the ripple caused by the power electronics 110, 112, 114, or 116 performing EIS monitoring when the waveforms are summed at the DC bus 118. For example, a waveform generator may be connected to output connections 120, 122, 124, or 126 to inject canceling ripples in response to EIS monitoring.

Figure 2A:
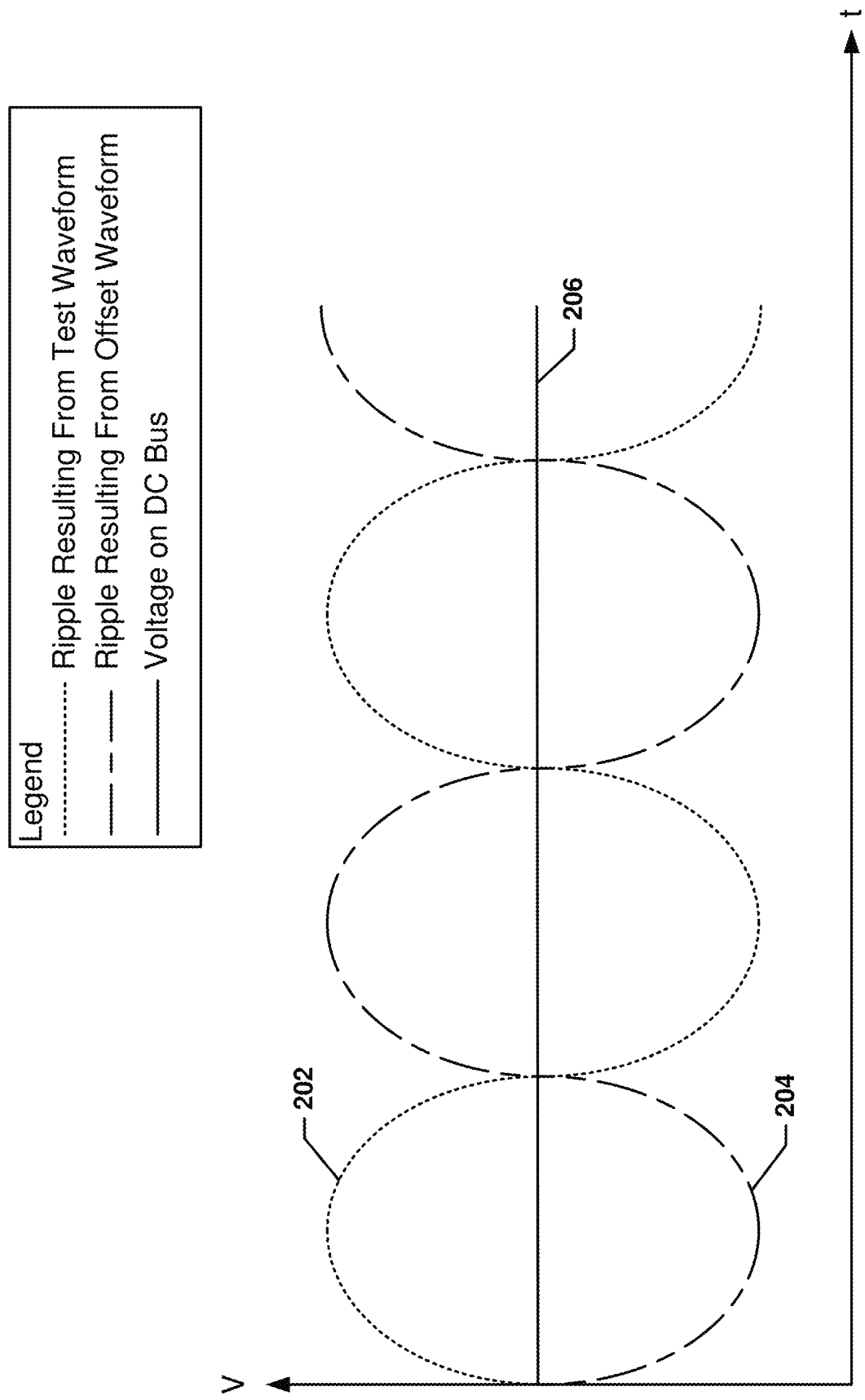
FIGS. 2A and 2B are graphs illustrating canceling ripples on a DC bus over time.

FIG. 2A is a graph illustrating canceling ripples on a DC bus over time. A test waveform injected onto an input connection of a battery by a power electronics may result in a ripple 202 sent from the power electronics injecting the test waveform toward a DC bus. An offset waveform injected onto an input connection of another battery by another power electronics may result in a ripple 204 sent from that power electronics injecting the offset waveform toward the DC bus. The offset waveform may be selected such that the ripple 204 is 180 degrees out of phase with the ripple 202. The power electronics may be connected to the DC bus in parallel and the sum of the ripple 202 and the ripple 204 may cancel each other out such that the sum of the waveforms is the desired DC voltage 206 on the DC bus.

Figure 2B:
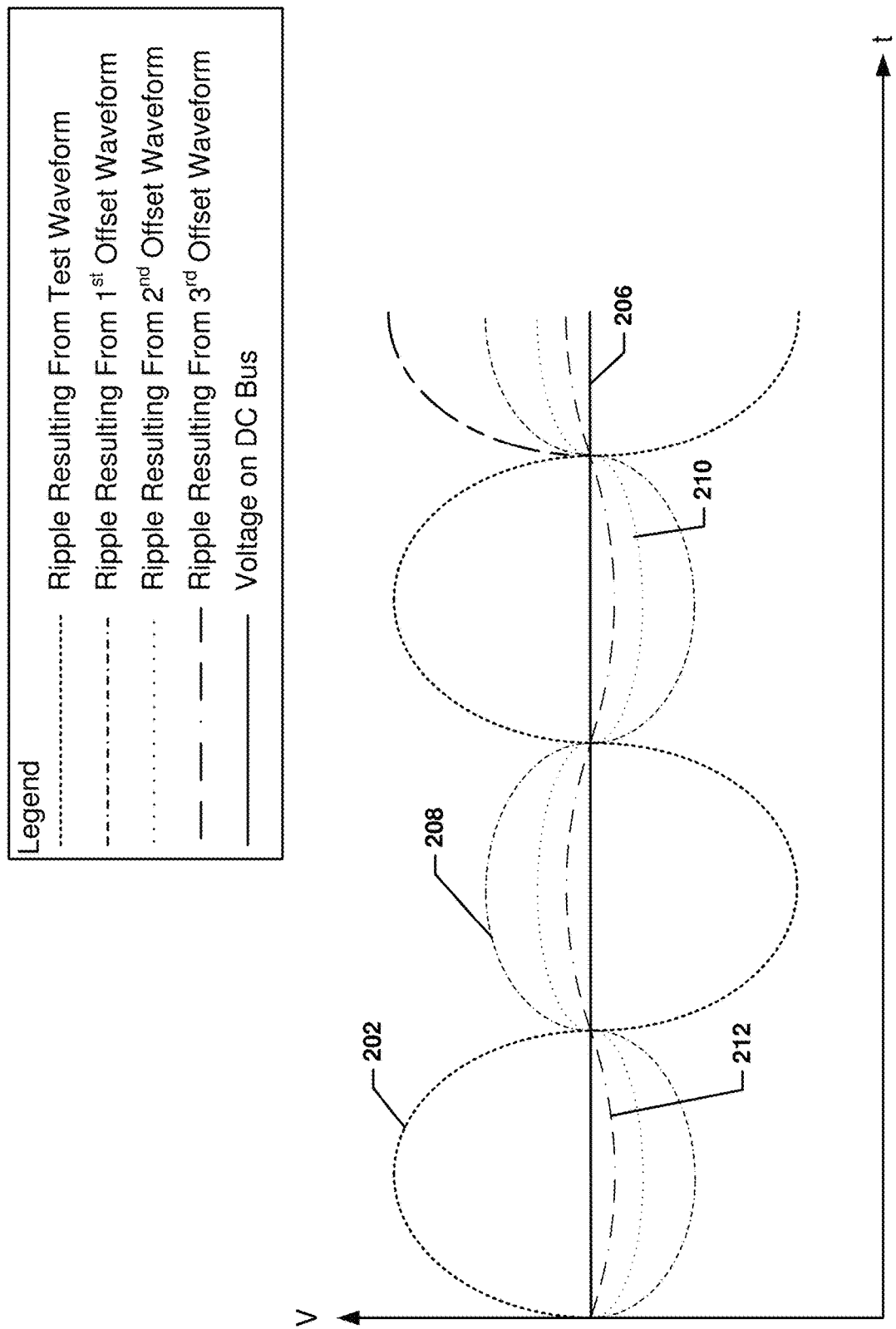

FIG. 2B is another graph illustrating canceling ripples on a DC bus over time using more than one offsetting waveform. As discussed above, a test waveform injected onto an input connection of a battery by a power electronics may result in a ripple 202 sent from the power electronics injecting the test waveform toward a DC bus. Three other power electronics may be used to generate offset waveforms injected onto input connections of three other batteries. The first offset waveform injected onto an input connection of a first other battery by the first other power electronics may result in a ripple 208 sent from that first other power electronics injecting the offset waveform toward the DC bus. The second offset waveform injected onto an input connection of a second other battery by the second other power electronics may result in a ripple 210 sent from that second other power electronics injecting the offset waveform toward the DC bus. The third offset waveform injected onto an input connection of a third other battery by the third other power electronics may result in a ripple 212 sent from that third other power electronics injecting the offset waveform toward the DC bus. The three offset waveforms may be selected such that the sum of the ripples 208, 210, and 212 may cancel ripple 202 such that the sum of the waveforms is the desired DC voltage 206 on the DC bus. While illustrated in FIGS. 2A and 2B as one generated offsetting ripple 204 or three offsetting ripples 208, 210, 212 with the same frequency as the ripple 202, more or less offsetting ripples, with different waveforms, different frequencies, phases, amplitudes, etc. may be generated and injected toward the DC bus as long as the total of any offsetting ripples plus the ripple 202 sent from the power electronics injecting the test waveform toward the DC bus results in the desired DC voltage 206 on the DC bus with no ripple.

Figure 3:
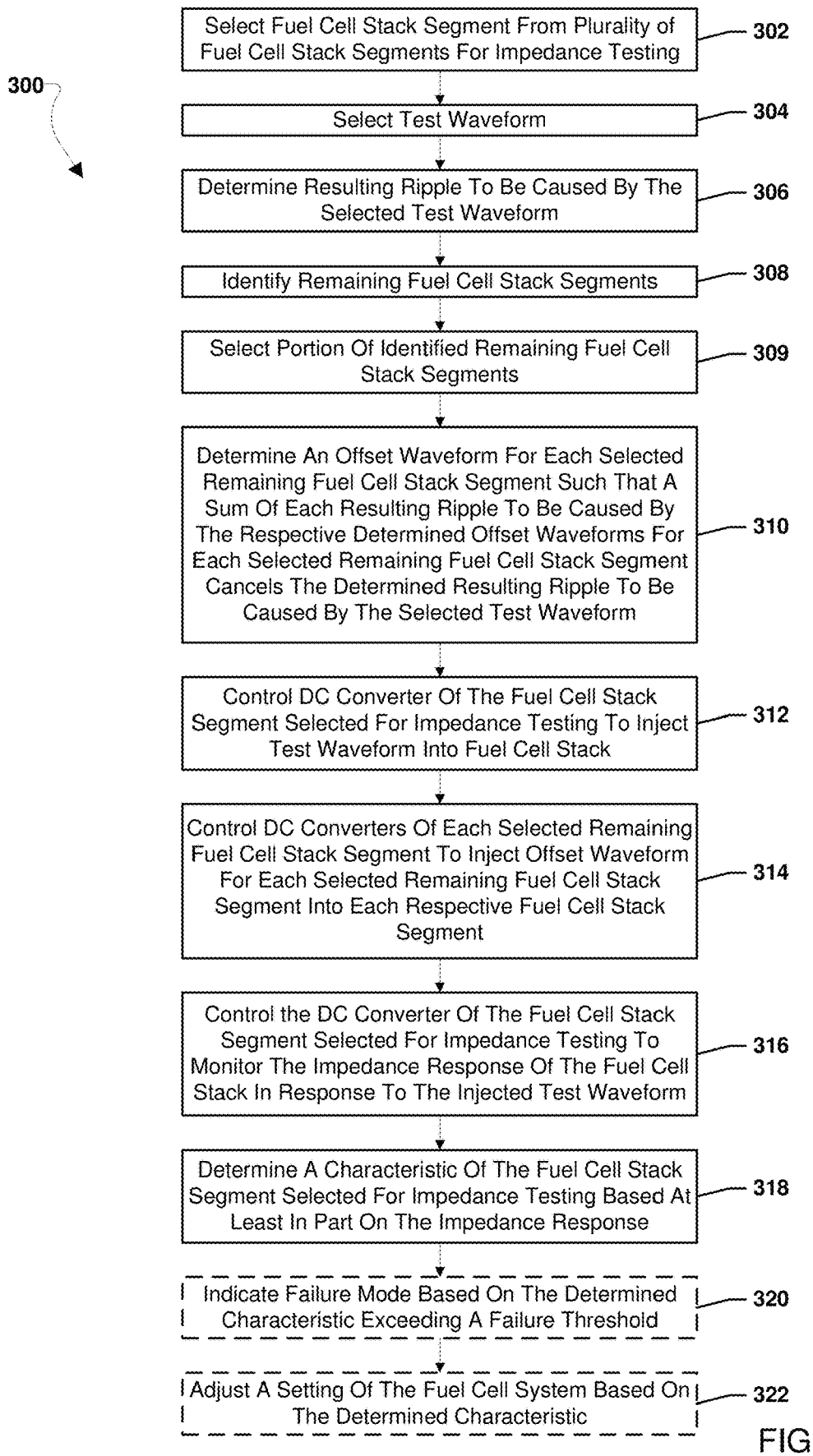
FIG. 3 is a process flow diagram illustrating an embodiment method for canceling the ripple to a DC bus caused by a test waveform.

FIG. 3 illustrates an embodiment method 300 for performing an EIS procedure on a battery stack. In an embodiment, the operations of method 300 may be performed by a controller, such as controller 138. The operations of method 300 are discussed in terms of battery stack segments and DC converters, but battery stack segments and converters are used merely as examples. Other batteries and/or other power electronics may be used in the various operations of method 300.

In block 302, the controller 138 may select a battery stack segment from a plurality of battery stack segments for impedance testing. For example, the battery stack segment may be selected based on a testing protocol governing when and in what order battery stack segments may be tested. In block 304 the controller 138 may select a test waveform. The test waveform may be selected to generate necessary oscillations for EIS monitoring, such as oscillations of approximately 1 Hz.

In block 306, the controller 138 may determine a resulting ripple to be caused by the selected test waveform. As discussed above, the resulting ripple may be the ripple output to the DC bus from the DC converter injecting the test waveform. In block 308 the controller 138 may identify the remaining battery stack segments. The remaining battery stack segments may be the battery stack segments not selected for impedance testing. In block 310 the controller 138 may select a portion of the identified remaining battery stack segments. In an embodiment, the selected portion may be all identified remaining battery stack segments. In another embodiment, the selected portion may be less than all identified remaining battery stack segments, such as only a single identified remaining battery stack segment.

In block 310, the controller 138 may determine an offset waveform for each selected remaining battery stack segment such that a sum of each resulting ripple to be caused by the respective determined offset waveforms for each selected remaining battery stack segment cancels the determined resulting ripple to be caused by the selected test waveform. In an embodiment, each offset waveform may be generated such that the resulting ripple is the same, such as one, two, three or more equal ripples that together cancel the ripple from the test waveform. In another embodiment, each offset waveform may be generated such that the resulting ripples are different, such as two, three, or more different ripples that together cancel the ripple from the test waveform.

In block 312, the controller 138 may control the DC converter of the battery stack segment selected for impedance testing to inject the test waveform into the battery stack. For example, the controller 138 may send control signals to a controller (e.g., 130, 132, 134, or 136) of the DC converter to cause the converter to perform pulse width modulation to generate the test waveform on an input connection to the battery stack segment.

In block 314, the controller 138 may control the DC converters of each selected remaining battery stack segment to inject the offset waveform for each selected remaining battery stack segment into each respective battery stack segment. For example, the controller 138 may send control signals to the controllers (e.g., 130, 132, 134, and/or 136) of the DC converters to cause the converters to perform pulse width modulation to generate the offset waveforms on an input connection to their respective battery stack segments.

The operations of the method 300 performed in blocks 312 and 314 may occur simultaneously, such that the test waveform and offset waveforms are injected at the same time resulting in ripples being output from the various DC converters that cancel each other out resulting in a desired DC voltage on the DC bus.

In block 316, the controller 138 may control the DC converter of the battery stack segment selected for impedance testing to monitor the impedance response of the battery stack in response to the injected test waveform. For example, the controller 138 may monitor the voltage and current response of the segment and determine the impedance according to method 500 described below with reference to FIG. 5.

In block 318, the controller 138 may determine a characteristic of the battery stack segment selected for impedance testing based at least in part on the impedance response. For example, the controller may use EIS monitoring to plot the real and imaginary parts of the measured impedances resulting from the injected test waveform and compare the plotted impedances to the known signatures of impedance responses of battery stack segments with known characteristics. The known signatures of impedance responses of the battery stack segments with known characteristics may be stored in a memory available to the controller (e.g., from a learned EIS database provided by an EISA network deployed in the cloud). The stored known signatures of impedance responses of the battery stack segments with known characteristics may be plots of the real and imaginary parts of the measured impedances of healthy battery stack segments and damaged/degraded battery stack segments derived from testing healthy (i.e., undamaged/undegraded) and damaged/degraded battery stack segments with various forms of damage (e.g., anode cracking) and/or degradation (e.g., segments operating in fuel starvation mode). The known characteristics may be correlated with the plots of the real and imaginary parts of the measured impedances stored in the memory. By matching the measured impedances to the known signatures of impedance responses, the current characteristics or state of the battery stack may be determined as those characteristics correlated with the matching known signature of impedance response.

In optional block 320, the controller 138 may indicate a failure mode based on the determined characteristic exceeding a failure threshold. For example, if the determined characteristic exceeds a failure threshold a failure mode of the battery stack may be indicated.

In optional block 322, the controller 138 may adjust a setting of the battery system based on the determined characteristic. For example, the controller 138 may initiate charging adjust a charging or discharging rate (e.g., increase or decrease), or shut off of the battery system based on the determined characteristic. In this manner, impedance testing, such as EIS monitoring, may be used in a battery system to adjust the operation of the battery system based on current characteristics of the battery stack segments.

Figure 4:
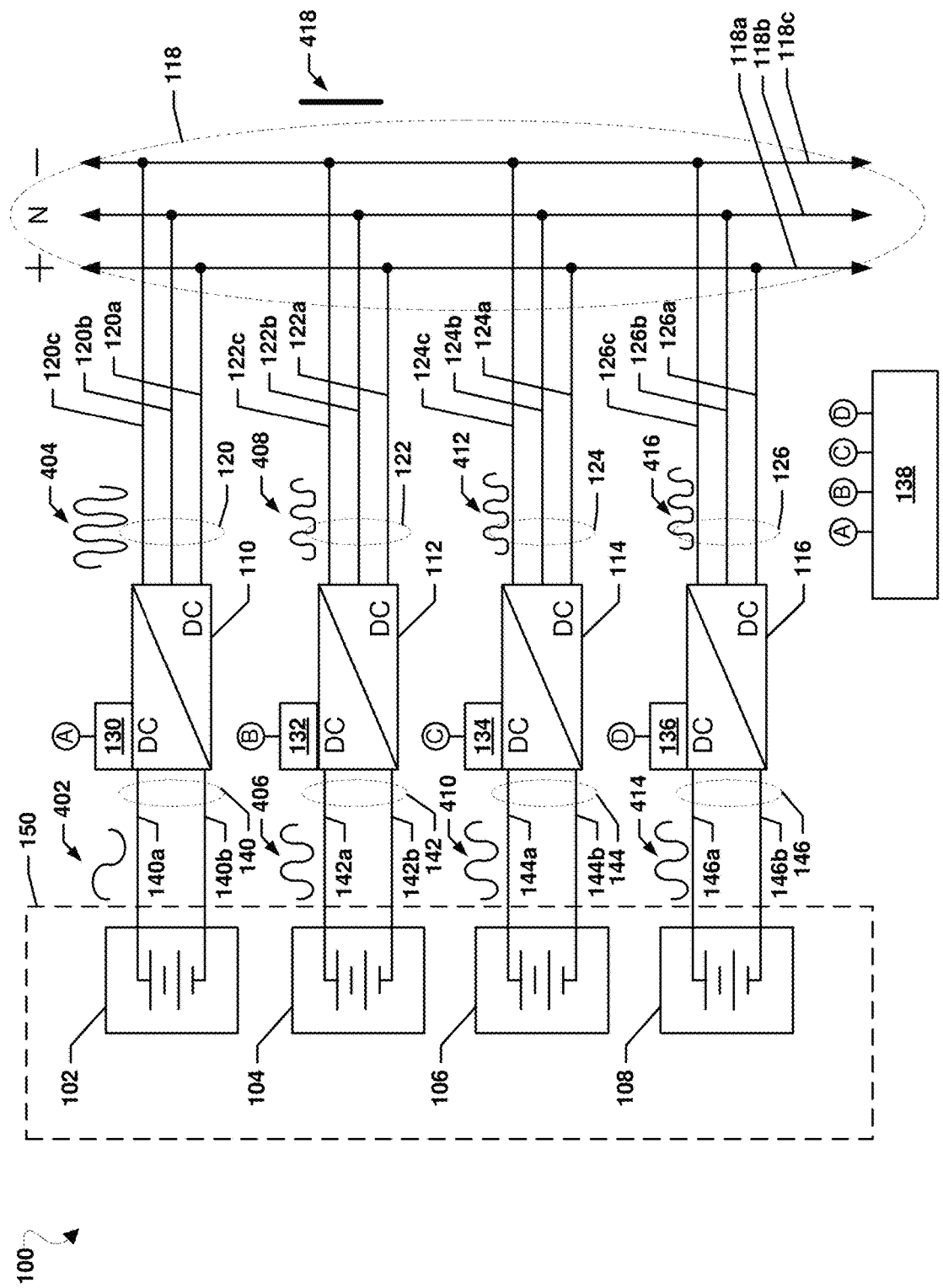
FIG. 4 is a block diagram of a system illustrating injected waveforms and resulting canceling ripples according to an embodiment.

FIG. 4 is a block diagram of the system 100 described above with reference to FIG. 1, illustrating injected waveforms 402, 406, 410, and 414 and resulting canceling ripples 404, 408, 412, and 416 according to an embodiment. A test waveform 402 may be injected into the input connection 140 resulting in a ripple 404 on the output connection 120 to the DC bus 118. An offset waveform 406 may be injected into the input connection 142 resulting in an offset ripple 408 on the output connection 122 to the DC bus 118. An offset waveform 410 may be injected into the input connection 144 resulting in an offset ripple 412 on the output connection 124 to the DC bus 118. An offset waveform 414 may be injected into the input connection 146 resulting in an offset ripple 416 on the output connection 126 to the DC bus 118. The sum of the ripples 404, 408, 412, and 416 may be such that steady DC voltage 418 without a ripple occurs on the DC bus 118 despite AC ripples occurring on the output connections 120, 122, 124, and 126. While the sum of the ripples 404, 408, 412, and 416 may be such that steady DC voltage 418 without a ripple results on the DC bus 118, the sum of the offset waveforms 406, 410, and 414 and the test waveform 402 need not equal zero. The offset ripples 408, 412, and 416 may all be the same or may be different. For example, offset ripple 408 may be a larger ripple than offset ripples 412 and 416. Additionally, whether or not the offset ripples 408, 412, and 416 are the same or different, the offset waveforms 406, 410, and 414 may not be the same. While three offset waveforms 406, 410, and 414 and their resulting offset ripples 408, 412, and 416 are illustrated, less offset waveforms and offset ripples, such as only two offset waveforms and resulting offset ripples or only one offset waveform and one resulting offset ripple, may be generated to offset the ripple 404.

In an alternative embodiment, the offset ripples 408, 412, and/or 416 may be generated by other devices, such as waveform generators, connected to output connections 122, 124, 126 and controlled by the controller 138, rather than the power electronics 112, 114, and/or 116. The offset ripples 408, 412, and/or 416 may be generated by the other devices such that the sum of the ripples 404, 408, 412, and 416 may be the steady DC voltage 418 without a ripple on the DC bus 118. Additionally, combinations of ripples generated by the power electronics 112, 114, and/or 116 and the other devices, such as additional waveform generators, may be used to cancel the ripple 404 resulting in the steady DC voltage 418 without a ripple on the DC bus 118.

Figure 5:
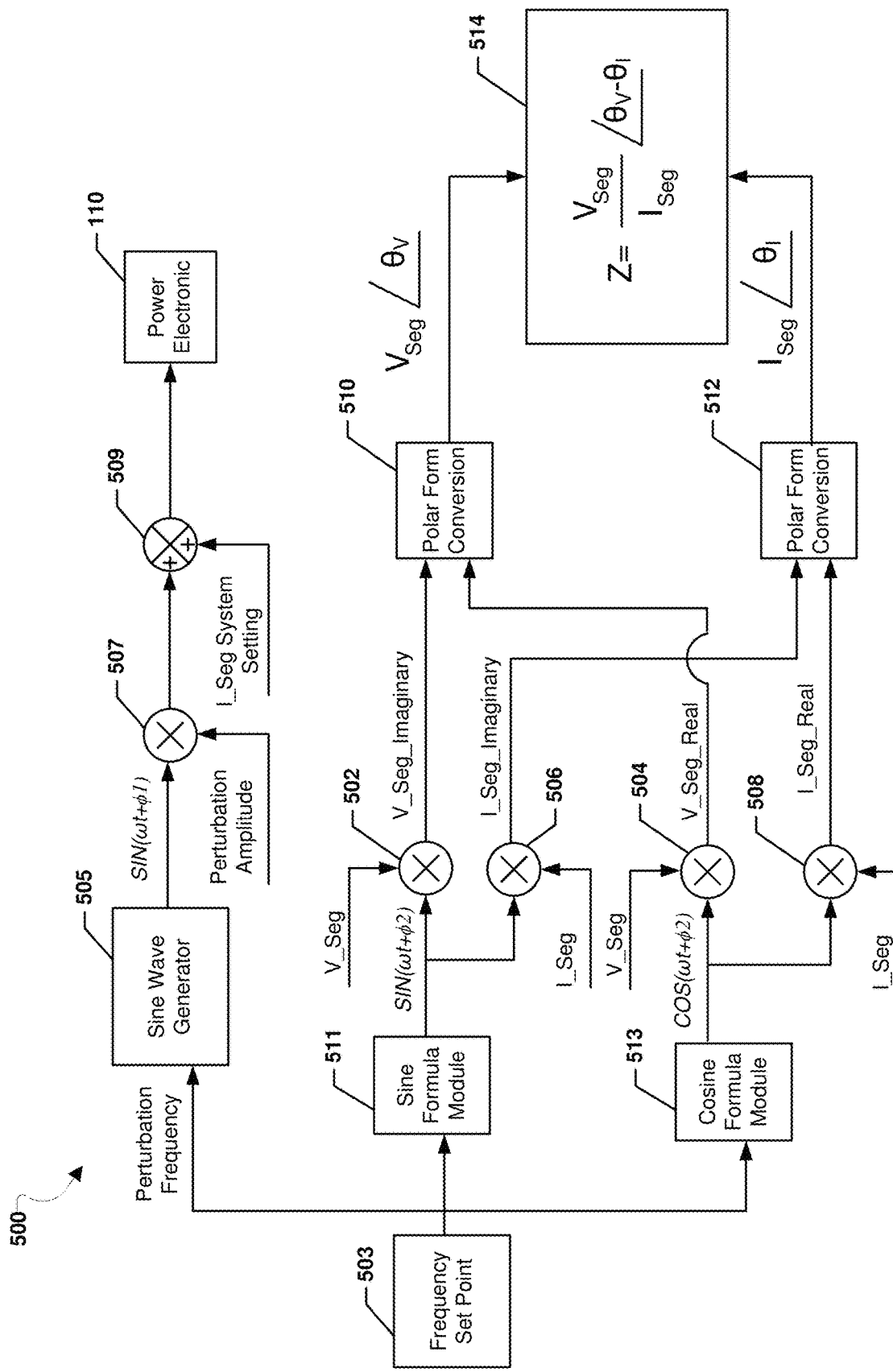
FIG. 5 is a component flow diagram illustrating an example waveform generator for determining an impedance response for a battery segment.

FIG. 5 is a system block diagram illustrating a waveform generator 500 for generating wave forms for performing EIS monitoring of a battery segment. The elements of the waveform generator 500 are discussed in terms of battery stack segments and DC converters, but battery stack segments and converters are used merely as examples. Other batteries and/or other power electronics may be used in the various operations of method 500. In an embodiment, the waveform generator 500 may operate in conjunction with the operations of method 300 described above with reference to FIG. 3.

In an input 503 the controller 138 may input a frequency set point (f) for a particular EIS monitoring process. The frequency set point may be output to a sine wave generator 505 as the perturbation frequency. The sine wave generator 505 may output a waveform SIN(ωt+φ1) in which ω is the fundamental frequency (2πf) and φ1 is the phase angle. In multiplier circuit 507 the output waveform multiplied by the perturbation amplitude, and the result may be added to the segment set as a system setting (I_Seg System Setting) in adder circuit 509 to generate a test waveform that may be sent to the power electronic 110 for injecting the waveform into the battery segment. The current for the segment set as a system setting may be a current setting provided from the controller 138 or another controller as a target current setting for the battery segment. The power electronic 110 illustrated in FIG. 5 may be any one of the power electronics 110, 112, 114, or 116 and similar operations may be performed to control power electronics 112, 114, and 116 to inject test waveforms.

The frequency set point may also be output to a sine formula module 511 and a cosine formula module 513. The sine formula module 511 may output a waveform SIN(ω+φ2) in which ω is the fundamental frequency (2πf) and φ2 is the phase angle. The cosine formula module 513 may output a waveform COS(ωt+φ2) in which ω is the fundamental frequency (2πf) and φ2 is the phase angle.

In multiplier circuit 502 the output waveform from the sine formula module 511 may be multiplied with the voltage of the segment (V_Seg) to determine the imaginary voltage component of the segment (V_Seg_Imaginary). In multiplier circuit 506 the output waveform from the sine formula module 511 may be multiplied with the current of the segment (I_Seg) to determine the imaginary current component of the segment (I_Seg_Imaginary).

In multiplier circuit 504 may multiply the output waveform from the cosine formula module 513 with the voltage of the segment (V_Seg) to determine the real voltage component of the segment (V_Seg_Real). In multiplier circuit 508 the output waveform from the cosine formula module 513 may be multiplied with the current of the segment (I_Seg) to determine the real current component of the segment (I_Seg_Real).

Module 510 and 512 may respectively convert the real and imaginary components of the voltage of the segment and the real and imaginary components of the current of the segment to polar form voltage of the segment and polar form current of the segment.

Module 514 may determine the impedance "Z" of the segment as the polar form voltage of the segment over the polar form current of the segment. In this manner, the waveform generator 500 may enable a Fourier series calculation to be used to allow for analysis of an imperfect sinusoidal ripple at the fundamental frequency without needing to calculate a full Fast Fourier Transform. This may increase the accuracy of the impedance calculation and decrease the processing time required to determine an impedance response in comparison to impedance determinations made using a full Fast Fourier Transform.

Figure 6:
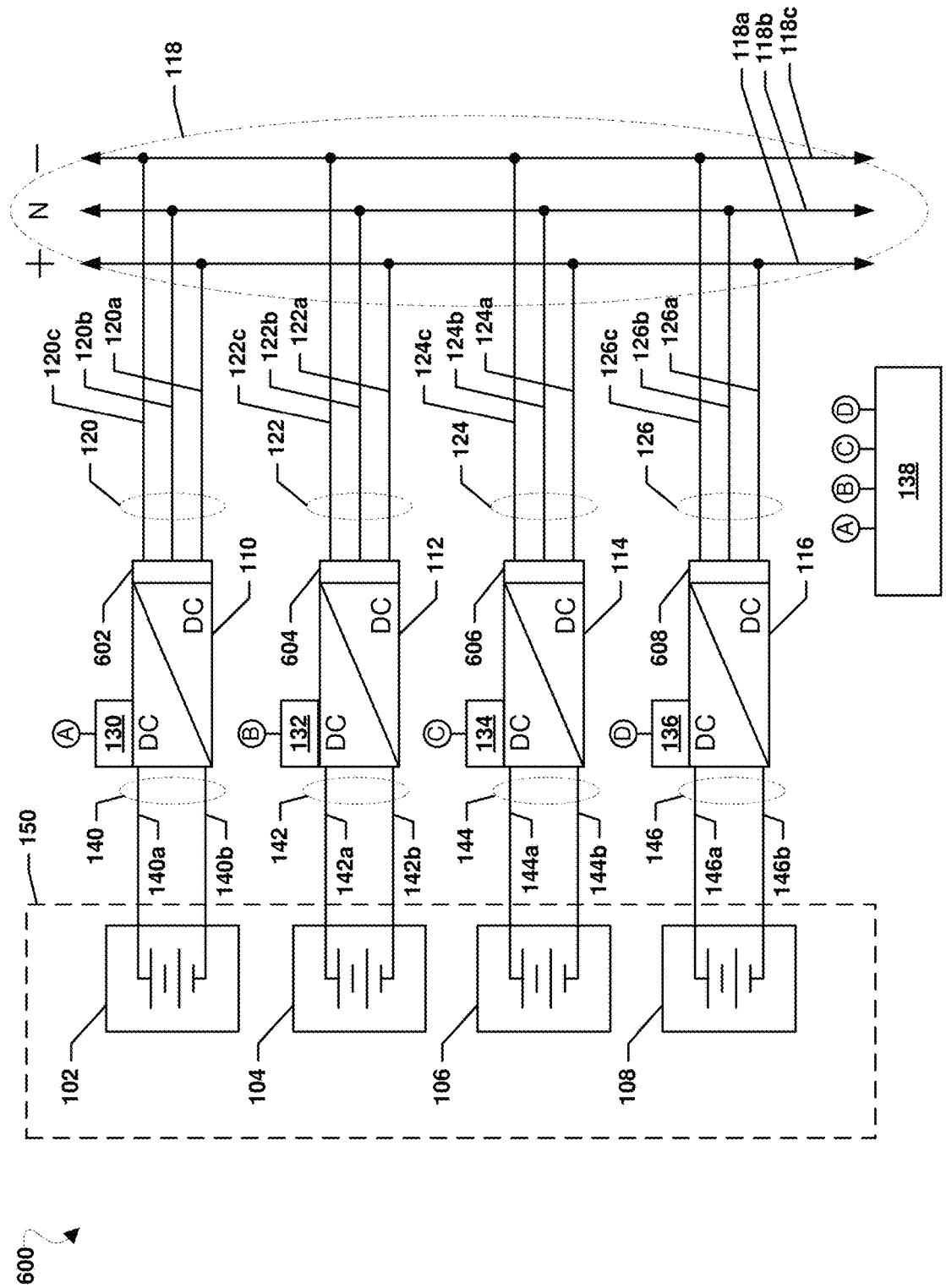
FIG. 6 is a block diagram of a system according to another embodiment.

FIG. 6 is a block diagram of a system 600 according to another embodiment. The system 600 is similar to system 100 illustrated in FIG. 1 and includes a number of components in common. Those components which are common to both systems 100 and 600 are numbered with the same numbers in FIGS. 1 and 6 and will not be described further.

The system 600 is similar to the system 100 described above with reference to FIG. 1, except that energy storage devices 602, 604, 606, and 608 may be included on the power electronics 110, 112, 114, and 116, respectively. Energy storage devices 602, 604, 606, and 608 may be any type of energy storage devices, such as capacitors, supercapacitors, batteries, etc. In an embodiment, the energy storage devices 602, 604, 606, and 608 may be on the output of their respective power electronics 110, 112, 114, and 116 to store ripple energy and discharge the ripple energy out of phase. The discharge out of phase by an energy storage device 602, 604, 606, or 608 may provide cancelation of the ripple current output on the respective output connection 120, 122, 124, or 126 to the DC bus 118 as a result of a test waveform injected into the input connection of the power electronic 110, 112, 114, or 116 associated with that energy storage device 602, 604, 606, or 608. In this manner, the energy storage device 602, 604, 606, or 608 may reduce the ripple current, or eliminate the ripple current, passing to the DC bus 118. The ability to reduce and/or eliminate the ripple current resulting from EIS testing may enable EIS testing using test waveforms with higher frequencies than may be used without the energy storage devices 602, 604, 606, or 608. For example, test waveforms with frequencies at or above 400 Hz may be used, greatly extending the bandwidth of the respective power electronics 110, 112, 114, and 116 to create and analyze test waveforms. Without the energy storage devices 602, 604, 606, or 608, the bandwidth of the test waveform frequencies may be practically limited to frequencies less than the switching frequency of the power electronics 110, 112, 114, and 116. With the energy storage devices 602, 604, 606, or 608, the bandwidth of the test waveform frequencies may extend to frequencies greater than the switching frequency of the power electronics 110, 112, 114, and 116.

While illustrated as on the output of their respective power electronics 110, 112, 114, and 116 in FIG. 6, the energy storage devices 602, 604, 606, and 608 may be on any other portions of their respective power electronics 110, 112, 114, and 116 to store ripple energy and discharge the ripple energy out of phase. In an alternative embodiment, the energy storage devices 602, 604, 606, and 608 may be on the input of their respective power electronics 110, 112, 114, and 116 to store ripple energy and discharge the ripple energy out of phase. In another alternative embodiment, an additional winding may be added to the transformers of the energy storage devices 602, 604, 606, and 608 and the energy storage devices 602, 604, 606, and 608 may be connected to the additional winding to store ripple energy and discharge the ripple energy out of phase.

EIS helps in understanding electrochemical processes by analyzing reflected electric signals that result when small, variable frequency electric signals are sent as test signals towards a battery or circuit under test. A battery's performance and health may be tested and characterized by analyzing the responses of batteries against different types of input waveforms (electric signals) using EIS.

U.S. Pat. No. 9,461,319, incorporated herein by reference in its entirety, teaches a method of performing EIS on fuel cells. A microcontroller, as shown part of an EIS system, may perform EIS tests with the help of a tester circuit. A microprocessor may apply and control the type of waveform and time of application, frequency of the signal, and other associated parameters. A battery may act as load to the input signals (small voltage signals). The output or response of the battery may be measured and stored. This data may be indicative of the state of the battery. For example, a 110 Hz sinusoidal signal may return as a phase shifted 110 Hz signal. The lead or lag angle (and amount of angle) plus the change in amplitude then may allow calculating the impedance with the V(phasor) and I(phasor) measurements. As another example, a 110 Hz sinusoidal signal may return as a chopped 105 Hz signal. The changes to the input signal may be a manifestation of changes happening inside the battery. The internal changes in the battery could be due to change in diffusion rate of ions at the electrode of the battery or due to wear and tear around the anode contact to the battery cells.

The various embodiments include an electrochemical impedance spectroscopy analyzer ("EISA") chip for a microelectromechanical system (MEMS). In various embodiments, the EISA chip may be configured to perform an EIS test on a battery and gather sensor data associated with a battery from sensors on the MEMS. The sensor data may be compared to sensor ranges. In response to determining that the sensor data is outside of the sensor ranges, the EIS response waveform from the EIS testing and the sensor data may be used to determine a state of the battery and a recommendation based on that state.

In various embodiments, the EISA chip may perform an EIS test on a battery in response to a sensor being triggered that draws current from the battery. The EISA chip may save data resulting from the EIS test and the data resulting from the EIS test may be used to determine how the battery is being used by the sensor. The determination of how the battery is being used by the sensor may be used in various manners. For example, the determination of how the battery is being used by the sensor may be indicated to a user (e.g., displayed in a GUI), may be used to adjust the battery settings, may be used to adjust the sensor settings, and/or may be used to adjust user device settings. In various embodiments, the characteristics of the battery as indicated by sensor readings may be paired with EIS testing results to generate data entries reflecting the performance of the battery during sensor operation. The data entries may operate as a report saved in a memory of the MEMS enabling the impact of activating a sensor on a battery to be determined from the saved report.

Figure 7A:
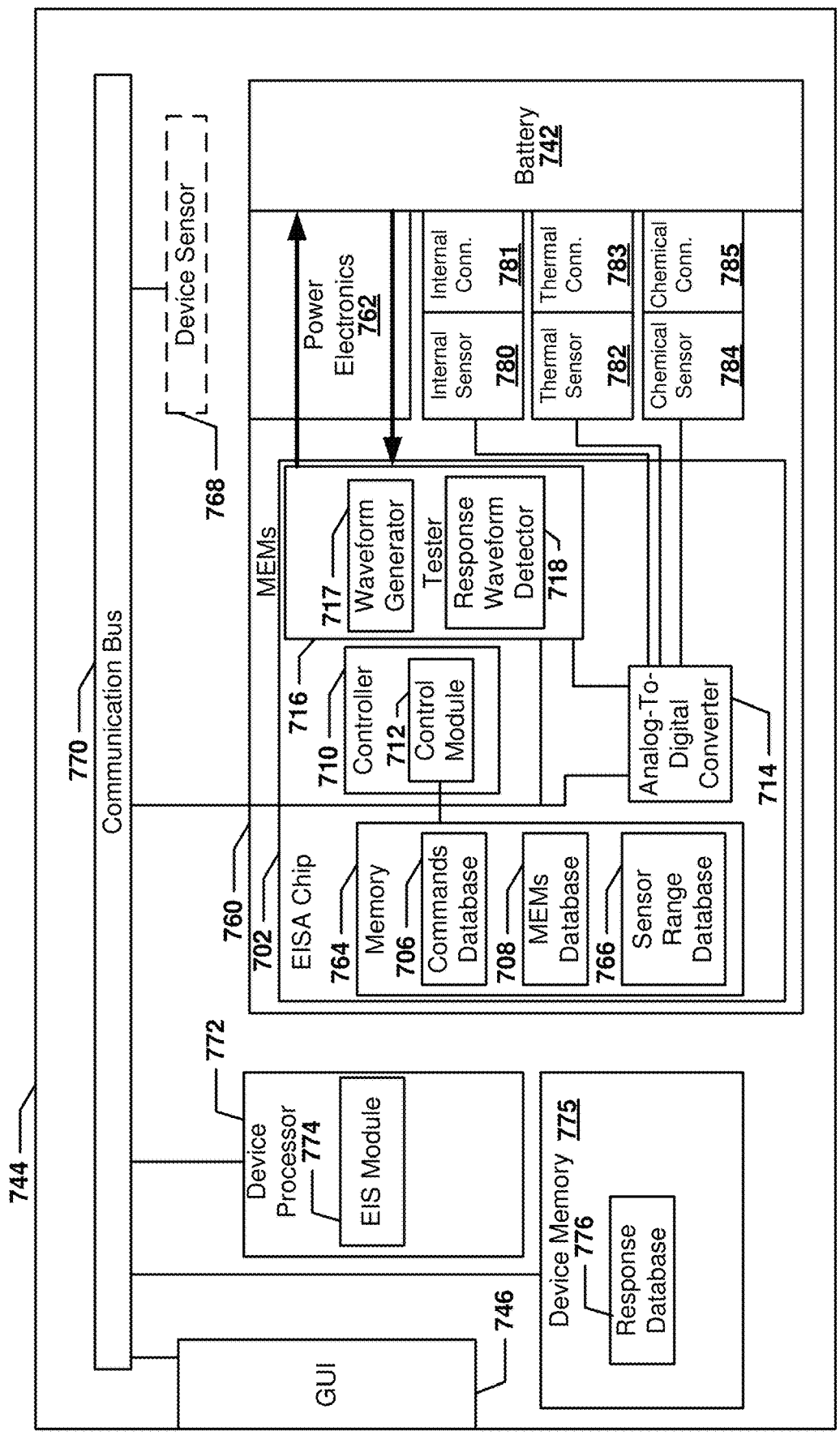
FIG. 7A is a block diagram of a device including a microelectromechanical system (MEMS) including an electrochemical impedance spectroscopy analyzer ("EISA") chip according to an embodiment.

FIG. 7A is a block diagram of a device 744, such as a battery-powered device, including a MEMS 760 according to an embodiment. The MEMS 760 may include an EISA chip 702. The EISA chip 702 may be a semiconductor EIS chip configured to perform EIS testing on the battery of the device 744. The device 744 may include a device processor 772, a device memory 775, and a graphical user interface (GUI) 746 connected to a communication bus 770. The MEMS 760 and the EISA chip 702 included as part of the MEMS 760 may be connected to the communication bus 770. Via their respective connections to the communication bus 770, the MEMS 760, EISA chip 702, device processor 772, GUI 746, and/or device memory 775 may exchange information. The device 744 may include a display configured to output the GUI 746 displaying indications to a user of the device 744, such as recommendations from an EIS module 774 running on the device processor 772. Such recommendations may be stored in the response database 776 in the device memory 775.

The MEMS 760 may be connected to a battery 742. The battery 742 may be any type rechargeable battery. The EISA chip 702 of the MEMS 760 may connect to the battery 742 via one or more power electronics 762 included on the MEMS 760. The EISA chip 702 of the MEMS 760 may include a controller 710 running a control module 712. In various embodiments, the control module 712 may control EIS testing by the various components of the EISA chip 702.

The EISA chip 702 of the MEMS 760 may include a memory 764 storing an EISA chip memory commands database 706, an EISA chip memory MEMS database 708, and an EISA chip memory sensor range database 766. The memory 764 may be built on the EISA chip 702 and may store the hardware code to be run by the controller 710 on the EISA chip 702 and may also include portions to store the sensor data and EIS test data, such as the EISA chip memory MEMS database 708. The EISA chip memory commands database 706 may store command data for test waveforms, such as "Measure for 5 seconds". The EISA chip memory MEMS database 708 may store test waveforms and parameters, such as parameters describing the signal (e.g., frequency being 110 Hz, current 3 mA, etc.). Additionally, the EISA chip memory MEMS database 708 may store response waveforms and sensor data output by sensors of the MEMS 760. The EISA chip memory sensor range database 766 may store normal (or expected or preferred) ranges of sensor data for the sensors of the MEMS 760.

The EISA chip 702 of the MEMS 760 may include a tester 716. To perform EIS testing, the control module 712 may initiate the set of commands from the EISA chip memory commands database 706 and the parameters in the EISA chip memory MEMS database 708 to cause the information from the databases 706, 708 to be run through a Digital-to-Analog Converter of the controller 710 to generate a test waveform for a tester 716. The battery tester circuit 716 may include a test waveform generator 717 configured to apply EIS test waveforms to the battery 742, and a response waveform detector 718 configured to measure voltage and/or current across the battery at sampling intervals to determine response waveforms. Alternatively, the response waveform detector 718 may provide analog measurements of voltage or current across the battery to the Analog-to-Digital converter 714 to generate a digitized response waveform. The digitized result data may be stored in the EISA chip memory MEMS database 708. Thus, the EISA chip memory MEMS database 708 may store various types of information including, test waveform data, the response waveform of the battery 742 received by the tester 716, sensor data received from the sensors of the MEMS 760, etc. The data entries in the EISA chip memory MEMS database 708 including the response waveform from EIS testing of the battery 742 may be retrieved by the control module 712 from the EISA chip memory MEMS database 708 and sent to the EIS module 774 of the device processor 772 via the communication bus 770.

The MEMS 760 may include one or more sensors configured to monitor the battery 742, such as an internal sensor 780 positioned within the battery, a thermal sensor 782, and a chemical sensor 784. The sensors 780, 782, 784 may be bonded to the battery 742 via connectors 781, 783, 785. The internal sensor 780 may be connected to the battery 742 by an internal type connection 781. The thermal sensor 782 may be connected to the battery 742 by a thermal type connection. The chemical sensor 784 may be connected to the battery 742 by a chemical type connection 785. For example, the thermal sensor 782 may be bonded to the battery 742 with a thermally conductive bond. For example, the chemical sensor 784, may react to and signal corrosive material and may be attached at the battery 742 leads to a battery interface. For example, the internal sensor 780 may be a sensor that the battery manufacturer may position within the battery 742 with electrical connections 781 extending from the battery 742. As a specific example, the internal sensor 780 may measure the internal resistance of a key cathode connection of the battery 742. The EISA chip 702 of the MEMS 760 may include an analog-to-digital converter 714, and the sensors 780, 782, 784 may be configured to output sensor data to the analog-to-digital converter 714. The analog-to-digital converter 714 may output the digitized sensor data to the EISA chip memory MEMS database 708.

The power electronics 762 may be disposed on the MEMS 760 between the EISA chip 702 and the battery 742. The power electronics 762 may electrically connect a portion of the ESIA chip 702, such as the tester 716 of the EISA chip 702, to the battery 742. The power electronics 762 may include a DC to AC converter, an AC to DC converter, etc. The power from outside the device 744 to charge the battery 742 may pass through the power electronics 762. Additionally, the power electronics 762 may manage charging to bring power in from outside the device 744 and provide the EISA chip 702 of the MEMS 760 with analog signals representing the response waveforms generated in response to applying test waveforms. The power electronics 762 may be configured to input test waveforms into the battery and receive response waveforms from the battery while charging or discharging the battery.

The controller 710, the memory 764, the analog-to-digital converter 714, and the tester 716 may all be interconnected by a bus of the EISA chip 702 and/or MEMS 760 to exchange information with one another.

In some optional embodiments, the device 744 may include a device sensor 768 connected to the communication bus 770. The device sensor 768 may draw current from the battery 742 and may be triggered by the device processor 772. In some embodiments, when the device sensor 768 is triggered, an indication may be provided to the control module 712 of the EISA chip 702.

In an example operation of the device 744, the control module 712 of the EISA chip 702 may send a command to the tester 716 from the EIS chip memory commands database 706 and may measure the response of the test command and the sensor data related to the test command received from the sensors 780, 782, 784. The response waveform and sensor data may be stored in the EIS chip memory MEMS database 708. The control module 712 of the EISA chip 702 may compare the sensor data received from the sensors 780, 782, 784 to the sensor range database 766 to determine whether the sensor data is within a normal (or expected or preferred) range. If the sensor data is outside of the normal (or expected or preferred) range stored in the sensor range database 766, the control module 712 of the EISA chip 702 may send the data entry for that sensor data to the EIS module 774. The EIS module 774 may compare the data entry to the response database 776 and may extract a recommendation from the response database 776 if there is a match between the received data entry and a data entry in the response database 776. The extracted recommendation from the response database 776 may be sent by the EIS module 774 to the GUI 746.

Figure 7B:
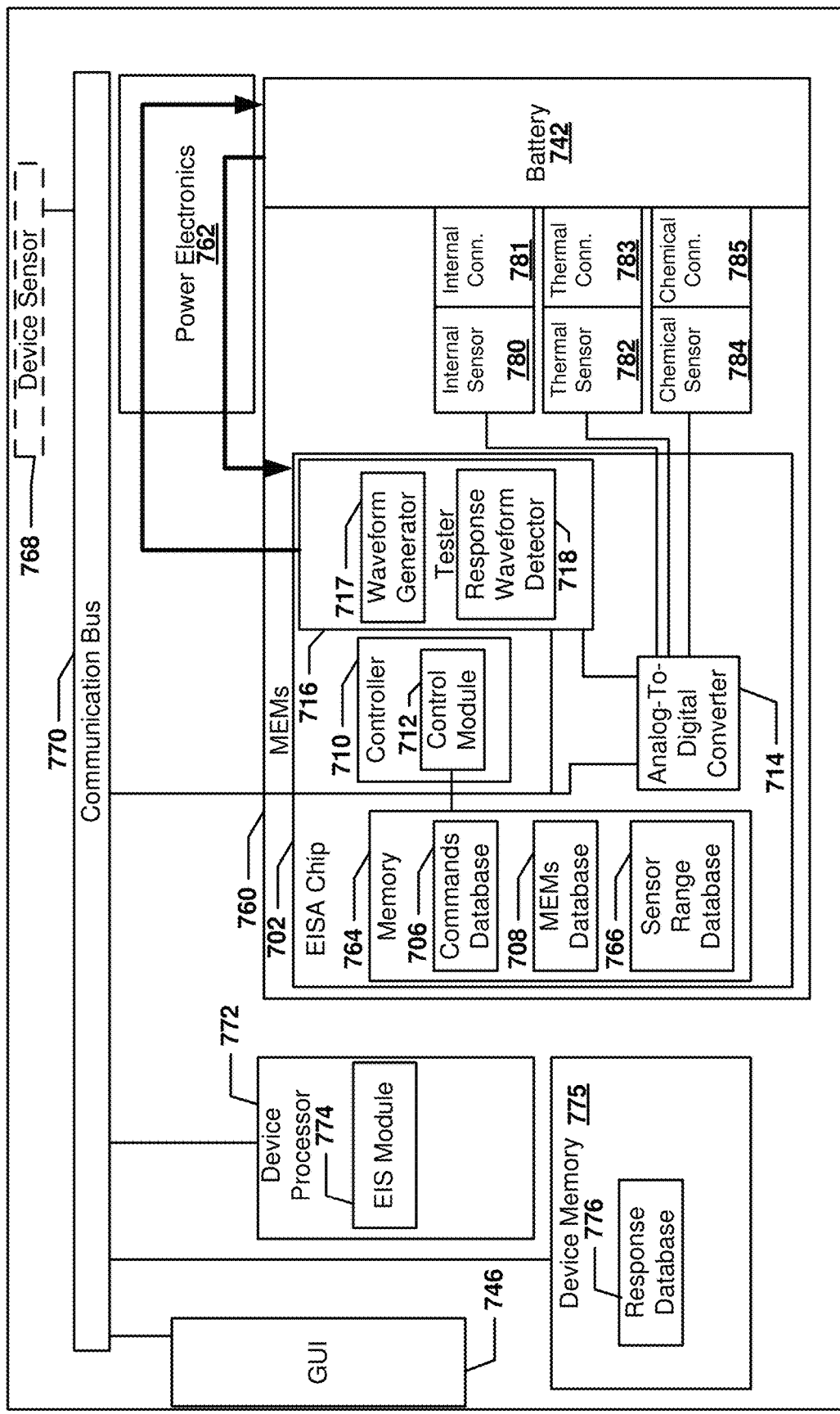
FIG. 7B is a block diagram of a device including a MEMS including an EISA chip according to another embodiment.

FIG. 7B is a block diagram of a device 744, such as a battery-powered device, including the MEMS 760 according to another embodiment. As illustrated in FIG. 7B, in some embodiments the power electronics 762 may be external to the MEMS 760. The device 744 is the same as described above with reference to FIG. 7A, except the power electronics 762 may be an off-board chip and the EISA chip 702 may send a signal out of the MEMS 760 to the power electronics to perform the EIS testing (e.g., which test waveform to add to the current of charging or discharging from the power electronics).

Figure 7C:
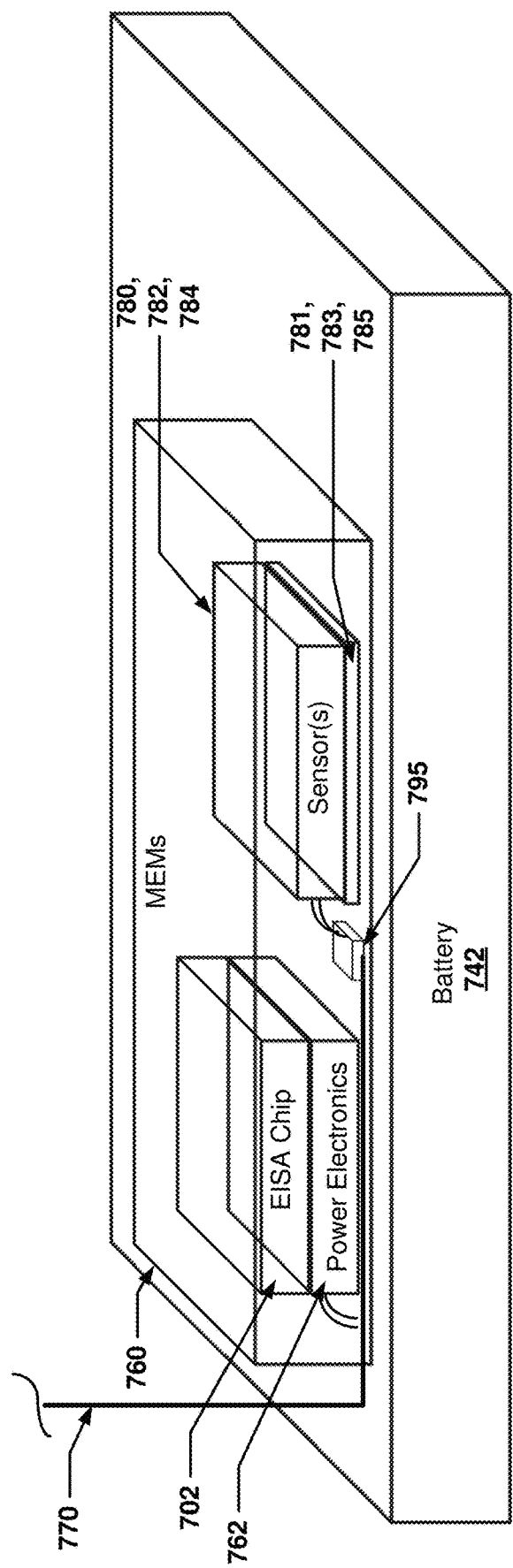
FIG. 7C is an isometric view of a MEMS according to various embodiments.

FIG. 7C is an isometric view of the MEMS 760 according to some embodiments. FIG. 7C shows the MEMS 760, the power electronics portion 762 between the EISA chip 702 and battery 742, sensors (e.g., sensors 780, 782, 784), sensors connectors (e.g., connections 781, 783, 785) to battery 742, sensor electrical connections 795 between the sensors and EISA chip 702, and the bus 770 that connects the sensor electrical connectors 795, the EISA chip 702, and the device processor 772. The arrangement of components illustrated in FIG. 7C is merely one example of how such compliments may be arranged on a battery 742, and is not intended to limit the scope of the claims to a particular arrangement of such compliments.

Figure 8A:
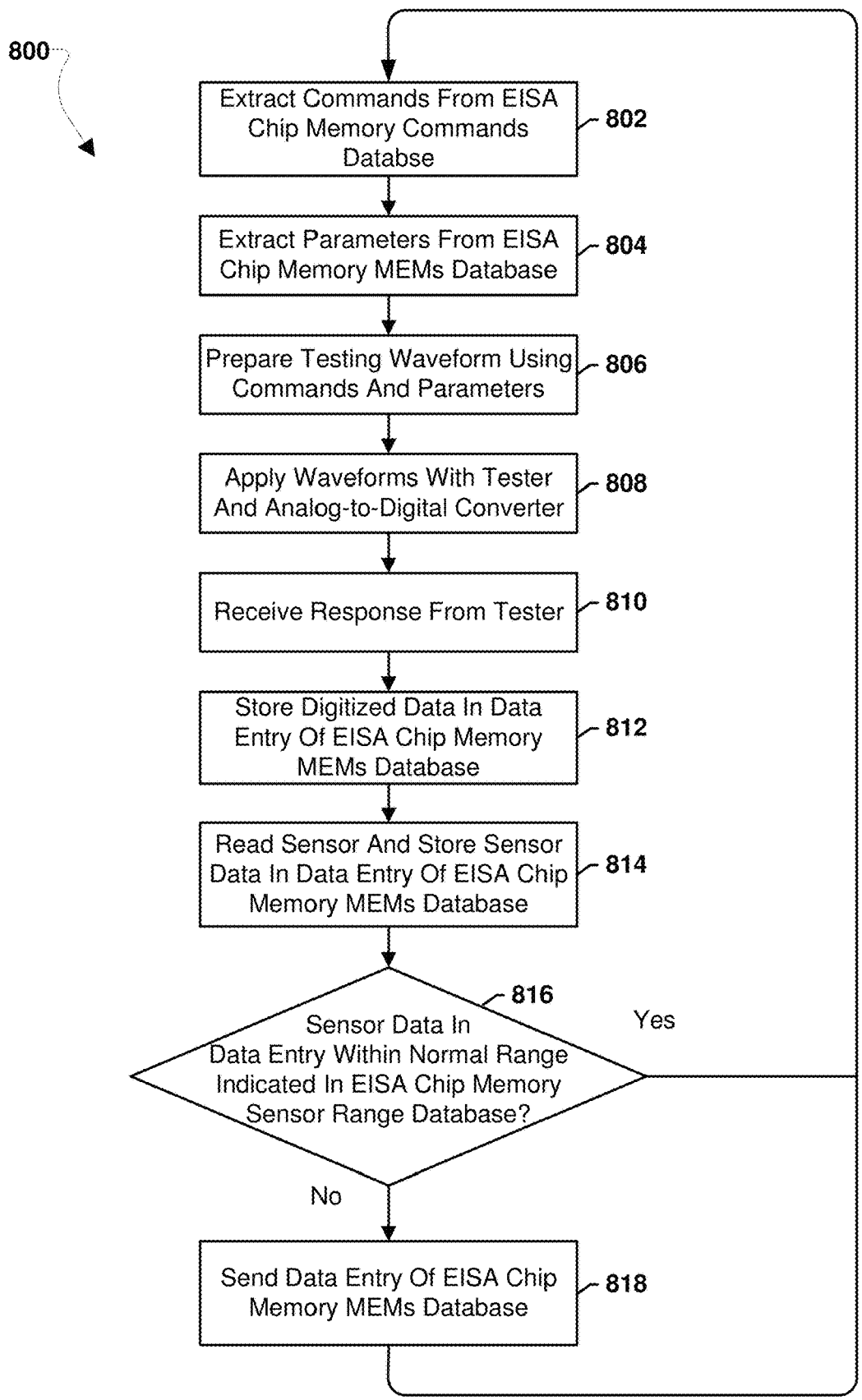
FIG. 8A is a process flow diagram illustrating an embodiment method for EIS testing of a battery.

FIG. 8A illustrates an embodiment method 800 for EIS testing of a battery. The method 800 may be implemented by an EISA chip control module (e.g., EISA chip control module 712) of an EISA chip controller (e.g., controller 710) of an EISA chip (e.g., EISA chip 702) of a MEMS (e.g., MEMS 760). The method 800 may enable sensor data and EIS response waveforms to be gathered for a battery (e.g., battery 742). In various embodiments, the operations of method 800 may be initiated by the EISA chip controller (e.g., controller 710). The EISA chip control module (e.g., EISA chip control module 712) of the EISA chip controller (e.g., EISA chip controller 710) may execute the commands from an EISA chip memory commands database (e.g., EISA chip memory commands database 706). The EISA chip memory commands database (e.g., EISA chip memory commands database 706) may include commands for generating test waveforms to be applied to a battery (e.g., battery 742) via a tester (e.g., tester 716). The tester (e.g., tester 716), EISA chip controller (e.g., EISA chip controller 710) and EISA chip memory (e.g., EISA chip memory 764) may all be connected via one or more communication buses on the EISA chip (e.g., EISA chip 702) and/or MEMS (e.g., MEMS 760) configured to enable the connected devices to exchange data and control instructions with one another. The commands may be single test waveforms or combinations of test waveforms applied for specific time intervals. For example, a command may be of the form "Apply input for 2 sec and take output for 3 sec". The output (e.g., the response waveform) of the test in response to the inputted test waveform may be received by the tester (e.g., tester 716) and passed to an analog-to-digital converter (e.g., analog-to-digital converter 714) such that the measured output response waveform may be stored in a digital form. The digitally converted output response waveform may be stored in an EISA chip memory MEMS database (e.g., EISA chip memory MEMS database 708) along with the input test waveform. Similarly, other sensors (e.g., sensors 780, 782, and/or 784) built on the MEMS (e.g., MEMS 760) may sense the battery (e.g., battery 742) conditions. The sensed signal from the other sensors (e.g., sensors 780, 782, and/or 784) built on the MEMS (e.g., MEMS 760) may be stored in the EISA chip memory MEMS database (e.g., EISA chip memory MEMS database 708) after the sensed signal may be converted into digital sensor data by the analog-to-digital converter (e.g., analog-to-digital converter 714). The EISA chip memory sensor range database (e.g., EISA chip memory sensor range database) may include the ranges of normal (or expected or preferred) sensor values with regards to various sensors (e.g., sensors 780, 782, and/or 784). If a sensed value is outside the range prescribed in the EISA chip memory sensor range database (e.g., EISA chip memory sensor range database) then the portion of the EISA chip memory MEMS database (e.g., EISA chip memory MEMS database 708) may be collected at that instance and sent to an EIS module (e.g., EIS module 774) of a device processor (e.g., device processor 772). Said another way, if sensor data is outside the normal (or expected or preferred) range listed in the EISA chip memory sensor range database (e.g., EISA chip memory sensor range database), the data entry including that sensor data outside the normal (or expected or preferred) range may be copied and sent to the EIS module (e.g., EIS module 774) of the device processor (e.g., device processor 772). The EISA chip control module (e.g., EISA chip control module 712) may continue the EIS testing and sensor data collection in a loop.

In block 802, the EISA chip control module may extract EIS testing commands from the EISA chip memory commands database. The control device may retrieve entries of EIS testing commands associated with the battery identifying information from the EISA chip memory commands database. Available EIS testing commands may be returned from the EISA chip memory commands database. An example of a memory structure correlating battery types, battery identifiers, and commands is described below with reference to FIG. 9.

In block 804, the EISA chip control module may extract parameters from the EISA chip memory MEMS database. The control device may retrieve entries of parameters, such as parameters that may define an EIS test waveform, associated with the battery identifying information from the EISA chip memory MEMS database. Available parameters may be returned from the EISA chip memory MEMS database.

In block 806, the EISA chip control module may prepare an EIS test waveform using EIS testing commands and parameters. The EISA chip control module may use the parameters to generate the EIS test waveform and use the EIS testing commands to determine for how long to generate the EIS test waveform. The EISA chip control module may load the parameters and the EIS testing commands and use the parameters and the EIS testing commands to signal a digital-to-analog converter with digital signals of instructions for generating the EIS test waveform.

In block 808, the EISA chip control module may apply the EIS test waveform to the battery (e.g., battery 742). The EISA chip control module may send the digital signals of instructions for generating the EIS test waveform to a digital-to-analog converter so that the digital-to-analog converter may convert the digital signals to analog signals. The analog signals may be provided to a tester (e.g., tester 716), which may respond to the analog signals by generating an EIS test waveform according to the instructions of the analog signals. The tester (e.g., tester 716) may apply the generated EIS test waveform to the battery (e.g., battery 472) coupled to the MEMS (e.g., MEMS 760). The tester may apply the generated EIS test waveform to the battery for a period as indicated by the analog signals and may cease generating the EIS test waveform upon expiration of the period.

In block 810, the EISA chip control module may receive a response waveform from the tester, which may determine the response waveform by measuring voltage or current across the battery at a sampling interval. The tester may receive a response waveform from the battery generated in response to the EIS test waveform. The tester may provide the measurements of voltage or current at the sampling interval to the analog-to-digital converter, which may convert the analog voltage or current samples to digital values that the control device may use to determine the response waveform In block 812, the EISA chip control module may store the digital response waveform to the EISA chip memory MEMS database. In some embodiments, the control device may format the digital response waveform as a digital data file, such as a ".dat" format file. The EISA chip control module may store the digital response waveform to the EISA chip memory MEMS database in a manner such that the digital response waveform may be associated with the test waveform and the command used to generate the response waveform in the EISA chip memory MEMS database.

In block 814, the EISA chip control module may read one or more sensor(s) and store the sensor data in the EISA chip memory MEMS database. For example, the EISA chip control module may poll a thermal sensor, internal sensor, and/or chemical sensor of the MEMS to generate sensor readings associated with the battery (e.g., battery 742). The sensors (e.g., sensors 780, 782, and/or 784) may sense the battery conditions. The sensed signal from the other sensors built on the MEMS may be converted into digital sensor data by an analog-to-digital converter (e.g., analog-to-digital converter 714) before being stored in the EISA chip memory MEMS database. The EISA chip control module may store the digital sensor data in the EISA chip memory MEMS database in a manner such that the sensor data may be associated with the test waveform, the command, and the response waveform in the EISA chip memory MEMS database. For example, the test waveform, the command, the response waveform, and the sensor data may all be stored in the same data entry in the EISA chip memory MEMS database.

In determination block 816, the EISA chip control module may determine whether the sensor data in the data entry is within a normal (or expected or preferred) range indicated in the EISA chip memory sensor range database. The EISA chip control module may compare the sensor data in the data entry to sensor data in the EISA chip memory sensor range database to determine whether the sensor data falls within the normal (or expected or preferred) range. An example of a memory structure correlating sensors and normal (or expected or preferred) ranges is described below with reference to FIG. 11. Sensor data determined to be within the ranges listed in the EISA chip memory sensor range database may indicate that the range is normal (or expected or preferred). Sensor data determined to be outside the ranges listed in the EISA chip memory sensor range database may indicate that the range is not normal (or expected or preferred).

In response to determining that the sensor data in the data entry is within a normal (or expected or preferred) range (i.e., determination block 816="Yes"), the EISA chip control module may extract commands from the EISA chip memory command database in block 802. In this manner, the method 800 may be repeated to EIS test the battery and read sensor data.

In response to determining that the sensor data in the data entry is outside a normal (or expected or preferred) range (i.e., determination block 816="No"), the EISA chip control module may send the data entry of the EISA chip memory MEMS database to an EIS module (e.g., EIS module 774) of a device processor (e.g., device processor 772). For example, the data entry may be sent via a communications bus of the device (e.g., communication bus 770) connecting the EISA chip to the device processor. An example of a memory structure correlating combinations of test waveform commands, testing waveforms, digital representations of the measured response waveforms, and sensor data together as a data entry is described below with reference to FIG. 10. In response to sending the data entry of the EISA chip memory MEMS database, the EISA chip control module may extract commands from the EISA chip memory command database in block 802. In this manner, the method 800 may be repeated to EIS test the battery and read sensor data.

Figure 8B:
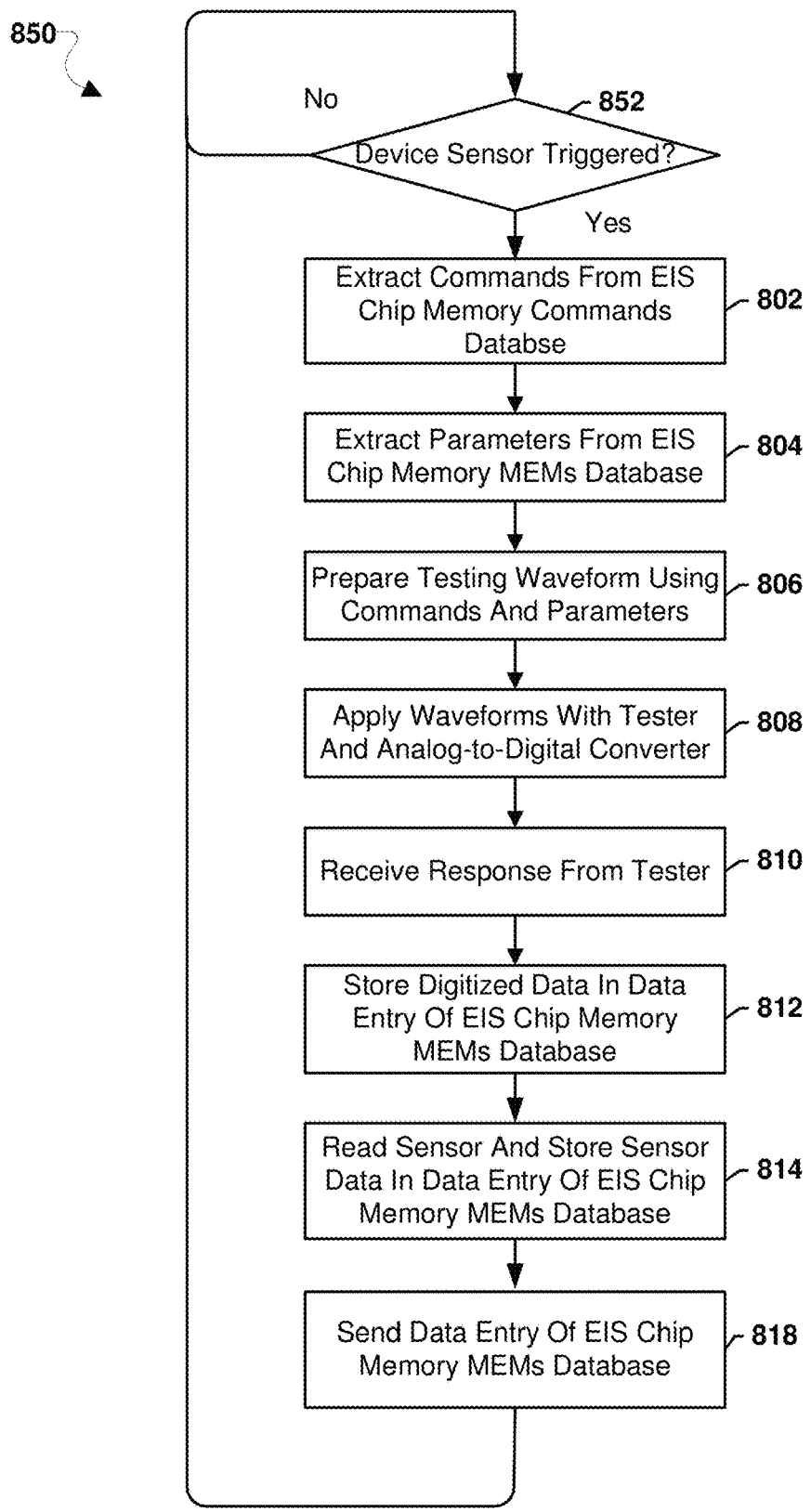
FIG. 8B is a process flow diagram illustrating another embodiment method for EIS testing of a battery.

FIG. 8B illustrates an embodiment method 850 for EIS testing of a battery. The method 850 may be implemented by an EISA chip control module (e.g., EISA chip control module 712) of an EISA chip controller (e.g., controller 710) of an EISA chip (e.g., EISA chip 702) of a MEMS (e.g., MEMS 760). The method 850 may enable sensor data and EIS response waveforms to be gathered for a battery (e.g., battery 742). In various embodiments, the operations of the method 850 may be initiated by the EISA chip controller (e.g., controller 710). In various embodiments, the operations of the method 850 may be performed in response to a device sensor (e.g., sensor 768) being triggered to draw current from a battery (e.g., battery 742). EIS testing of the battery while the device sensor is in operation and drawing current from the battery may enable the impact of the sensor on the battery to be characterized. In various embodiments, the operations of the method 850 may be performed in conjunction with the operations of the method 800.

In determination block 852, the EISA chip control module may determine whether a device sensor has been triggered. In some embodiments, the EISA chip control module may be connected to a communication bus (e.g., communication bus 770) of the device. When a sensor (e.g., sensor 768) draws current from the battery, the sensor and/or a processor controlling the sensor (e.g., device processor 772) may send an indication (e.g., an interrupt, message, etc.) to the EISA chip control module to indicate the device sensor was triggered. The EISA chip control module may monitor the communication bus for such indications to determine whether or not the device sensor was triggered. Until the device sensor is triggered (i.e., so long as determination block 852="No"), the EISA chip control module may continue to determine whether the device sensor has been triggered in determination block 852.

In response to determining that the device sensor was triggered (i.e., determination block 852="Yes"), the EISA chip control module may perform operations of blocks 802, 804, 806, 808, 810, 812, 814, and 818 of the method 800 as described above with reference to FIG. 8A. In this manner, data entries from the EIS chip memory MEMS database corresponding to times when the device sensor was triggered may be sent to the EIS module (e.g., EIS module 774) of the device processor (e.g., device processor 772). For example, the data entry may be sent via a communications bus of the device (e.g., communication bus 770) connecting the EISA chip to the device processor. The EISA chip control module may continue to determine whether the device sensor has been triggered in determination block 852

FIG. 9 is a table illustrating the EISA chip memory commands database 706 according to various embodiments, which may include EIS test commands for the on-chip tester 716 to run and receive the battery 742 response. The EISA chip memory commands database 706 may store the instruction that are to be sent to the tester 716 for conducting the EIS test. Column one 912 and column two 914 may store the battery type and battery identifier. Column three 916 may store the commands, such as when and for how long test waveforms are to be applied, and when and how long response waveforms are to be measured. There may be other form of commands possible that may be stored in the EISA chip memory commands database 706. The instructions may be as simple as "Apply input for 2 sec and take output for 3 sec" and/or may be represented by a complex pattern indicated with the help of a data file (e.g., a .DAT type file).

Figure 10:
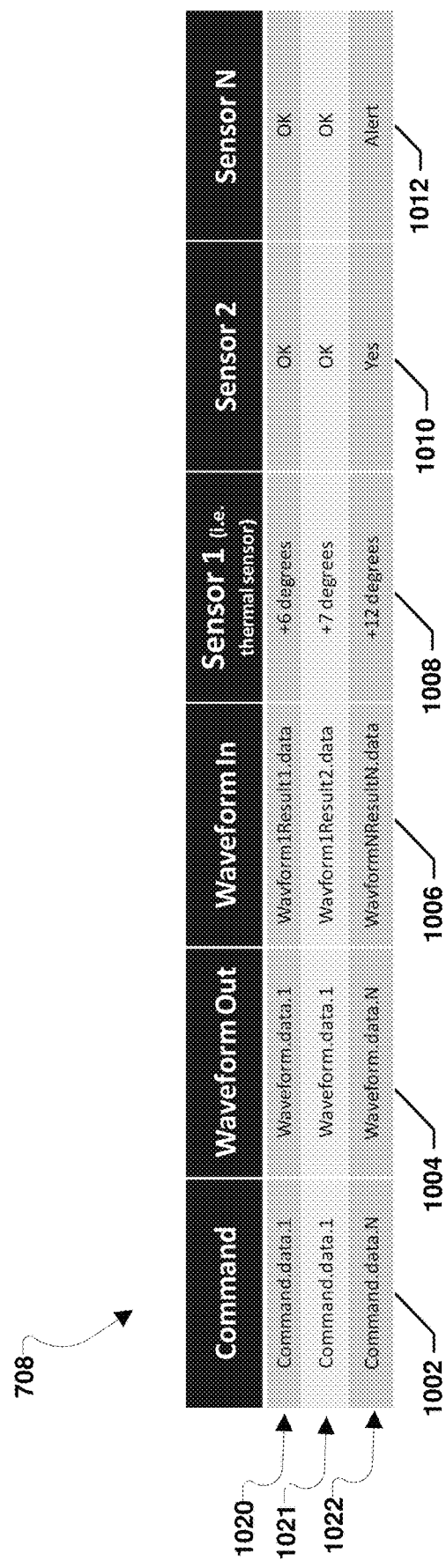
FIG. 10 is a table illustrating an example EISA chip memory MEMS database.

FIG. 10 is a table illustrating the EISA chip memory MEMS database 708 which may store data collected from EIS test and battery sensors (e.g., sensors 780, 782, 784). The table illustrated in FIG. 10 may represent the EISA chip memory MEMS database 708 after both EIS testing and sensor reading may be completed to populate full data entries. For example, FIG. 10 illustrates three data entries of the EISA chip memory MEMS database 708, specifically data entry 1020, data entry 1021, and data entry 1022. The data entries 1020, 1021, 1022 may each include various columns 1002-1012 of data. Column one 1002 may store the commands data that may be run to test the battery 742 associated with the device 744. Column two 1004 may store the test waveform that may be output to the battery 742 via tester 716. Column three 1006 may store the response waveform result that may be obtained for the test input (e.g., the test waveform) and commands. Column four 1008 may store the data from thermal sensor 782. For example, column four 1008 may indicate how much the temperature may be measured to be beyond the normal (or expected or preferred) operating range. Column five 1010 may store the chemical sensor 784 values. As an example, some values may indicate the absence of a chemical, such as the entry "Ok" in data entry 1020, while a presence of that chemical may be a non-normal (or non-expected or non-preferred) condition indicated by an entry, such as the entry "Yes" in data entry 1022 or an indication of the identifier of the chemical detected. Column six 1012 may store the output of a sensor 780 positioned within the battery 742. As an example, some values may indicate the absence of any issue with the internal portions of the battery (e.g., the internal portions are in a normal (or expected or preferred) condition), such as the entry "Ok" in data entry 1020, while a detection by the internal sensor 780 of a condition that is not normal (or non-expected or non-preferred) may be indicated by an entry, such as the entry "Alert" in data entry 1022 or an indication of the type of internal issue detected by the internal sensor 780. While three sensors results are illustrated in FIG. 10, there may be any number of sensor data columns present in the EISA chip memory MEMS database 708 corresponding to each sensor from which the EISA chip memory MEMS database 708 receives sensor data.

FIG. 11 is a table illustrating the EISA chip memory sensor range database 766. The EISA chip memory sensor range database 766 may include the normal (or expected or preferred) range of sensor values for various sensors that may be employed in measuring the battery, such as normal (or expected or preferred) ranges of sensor values for the internal sensor 780, thermal sensor 782, and chemical sensor 784. Column one 1102 may store the sensors and column two 1104 may store the normal (or expected or preferred) range for the associated sensor. A sensed value found to be outside the ranges in column two 1104 may indicate that the sensor data is not normal (or expected or preferred) and may result in the data entry (e.g., data entry 1020, 1021, 1022) of the EISA chip memory MEMS database 708 associated with the non-normal (or non-expected or non-preferred) sensor data being sent by the EISA chip control module 712 to the EIS module 774 running on the device processor 772. The EIS module 774 may use the received data entry (e.g., data entry 1020, 1021, 1022) to determine one or more recommendations to display in the GUI 746.

Figure 12:
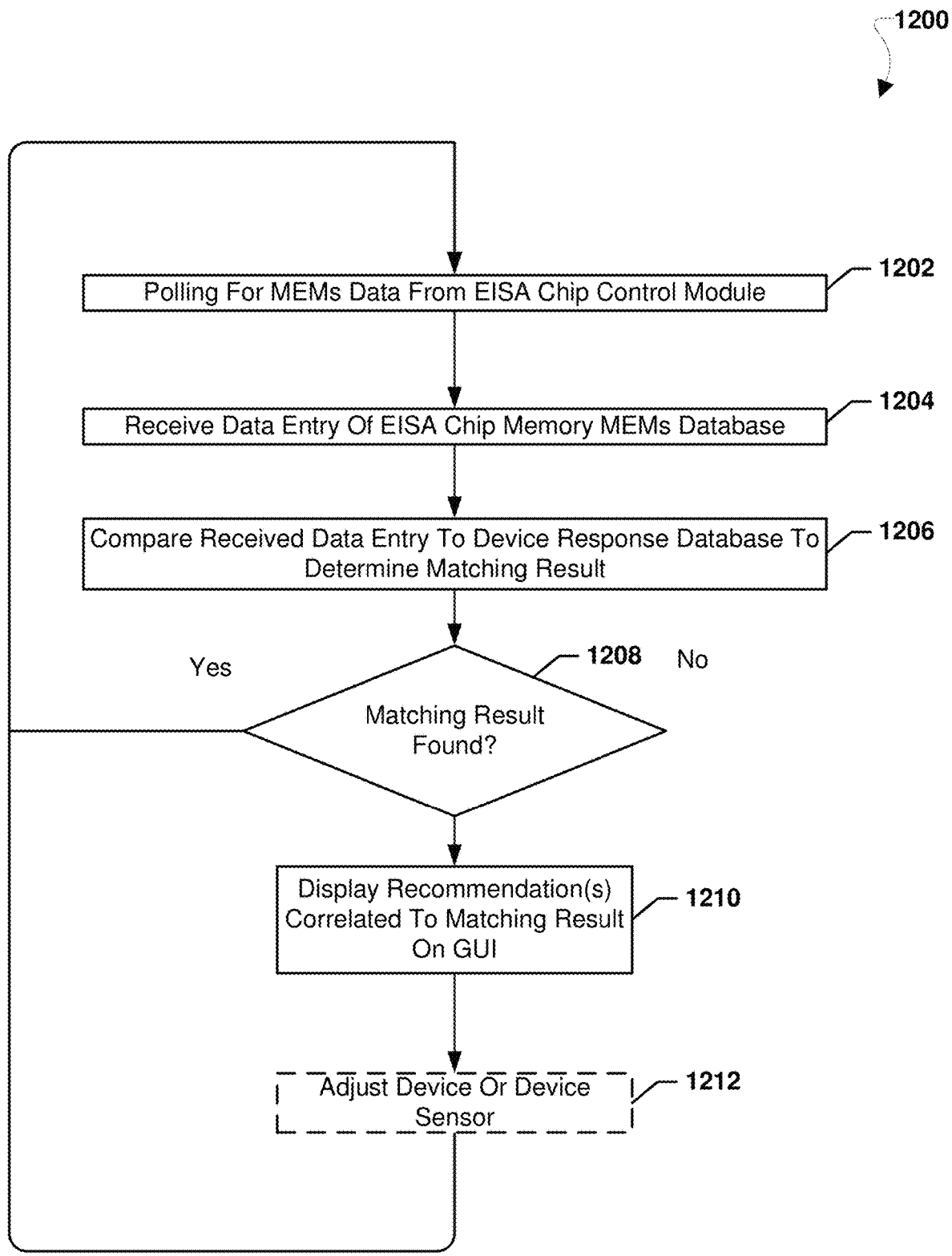
FIG. 12 is a process flow diagram illustrating an embodiment method for device management based on EIS testing.

FIG. 12 illustrates an embodiment method 1200 for device management based on EIS testing. The method 1200 may be implemented by an EIS module (e.g., EIS module 774) of a device processor (e.g., device processor 772) in communication with an EISA chip (e.g., EISA chip 702) of a MEMS (e.g., MEMS 760) connected to a battery (e.g., battery 742). The EIS module (e.g., EIS module 774) may be constantly polling for data entries from a MEMS database (e.g., EISA chip memory MEMS database 708) from the EISA chip control module (e.g., EISA chip control module 712) via a bus (e.g., communication bus 770). The EIS module (e.g., EIS module 774) may receive the data entries including the input waveform command (i.e., the test waveform command), input waveform (i.e., test waveform), response waveform, and sensor data and may compare a received data entry with a response database (e.g., response database 776). The response database (e.g., response database 776) may include combinations of the test waveform command, test waveform, response waveform, and sensor data correlated or associated with recommendations that may be displayed to the user of the device in a GUI. If there is a match between the received data entry and an entry in the response database (e.g., response database 776), then the corresponding recommendation may be displayed on a GUI (e.g., GUI 746).

The method 1200 may be implemented in software executing in a software-configurable processor (such as a central processing unit, graphics processing unit, etc.), in general purpose hardware, in dedicated hardware, or in a combination of a software-configured processor and dedicated hardware, such as a processor executing software within a device (e.g., device 744 of FIG. 7), and various memory/cache controllers. In order to encompass the alternative configurations enabled in various embodiments, the hardware implementing the method 1200 is referred to herein as a "control device." As one example implementation, the operations of method 1200 may be implemented in a control device that is configured to operate as an EIS module (e.g., EIS module 774 of FIG. 7).

In block 1202, the control device may poll for a MEMS data from an EISA chip control module (e.g., EISA chip control module 712). The EIS module (e.g., EIS module 774) may be constantly polling for data entries from a MEMS database (e.g., EISA chip memory MEMS database 708) from the EISA chip control module via a bus (e.g., communication bus 770).

In block 1204, the control device may receive a data entry of the EISA chip memory MEMS database. For example, the EISA chip control module may send a data entry including the test waveform command, the test waveform, the digital representations of the measured response waveform, and sensor data.

In block 1206, the control device may compare the received data entry to entries in a device response database (e.g., device response database 776) to determine whether there is a matching result. For example, the control device may compare the test waveform command, the test waveform, the digital representations of the measured response waveform, and sensor data received from the EISA chip control module to a recommendations database. The recommendations database may correlate combinations of test waveform commands, test waveforms, digital representations of the measured response waveforms, and sensor data with a respective recommendation, such as "Move Device Out Of Sun", "Alert User That Battery Could Explode", etc. An example of a memory structure correlating combinations of test waveform commands, test waveforms, digital representations of the measured response waveforms, and sensor data with recommendations is described below with reference to FIG. 13. For a given data entry sent from the EISA chip control module, the control device may parse the correlated test waveform commands, test waveforms, digital representations of the measured response waveforms, and sensor data for that data entry to find a matching data entry in the device response database.

In determination block 1208, the control device may determine whether a matching result was found between the received data entry and the device response database (e.g., device response database 776). In response to determining that no matching result was found (i.e., determination block 1208="No"), the control device may again poll for MEMS data in block 1202.

In response to determining that a matching result was found (i.e., determination block 1208="Yes"), the control device may display the one or more recommendations correlated to the matching result in the GUI in block 1210. The recommendations may be visual messages or other type indications that indicate the identified issue with the battery and/or an action for the user of the device to take. For example, the recommendations may be messages indicating "Move Device Out Of Sun", "Alert User That Battery Could Explode", or any other message. In response to the recommendations from the GUI, the user of the device may take the recommended action.

In optional block 1212, the control device may adjust the device or device sensor. In some embodiments, the control device may be configured to change the operation of the device (e.g., device 744) and/or device sensor (e.g., device sensor 768), for example the control device may be configured to adjust a setting of the device and/or a setting of the device sensor. The adjustment of the device and/or device sensor may be based on the recommendation correlated to the matching data entry in the device response database (e.g., response database 776). For example, the recommendation in the response database may be an indication of the type of adjustment to make to the device and/or device sensor. In some embodiments, the control device may change (or adjust) an operating setting of the device and/or device sensor, disconnect the device sensor from the battery, turn on/off the device and/or device sensor, or make any other type adjustment to the device and/or device sensor. Adjusting the device and/or device sensor may enable the operation of the device and/or device sensor to be managed to increase battery performance, increase battery operating time, or otherwise improve the battery operation in comparison to not making such adjustments. The adjustment of the device and/or device sensor may be optional as not all control devices may be configured to automatically adjust the device and/or device sensor. In response to adjusting the device and/or device sensor, the control device may again poll for MEMS data in block 1202.

Figure 13:
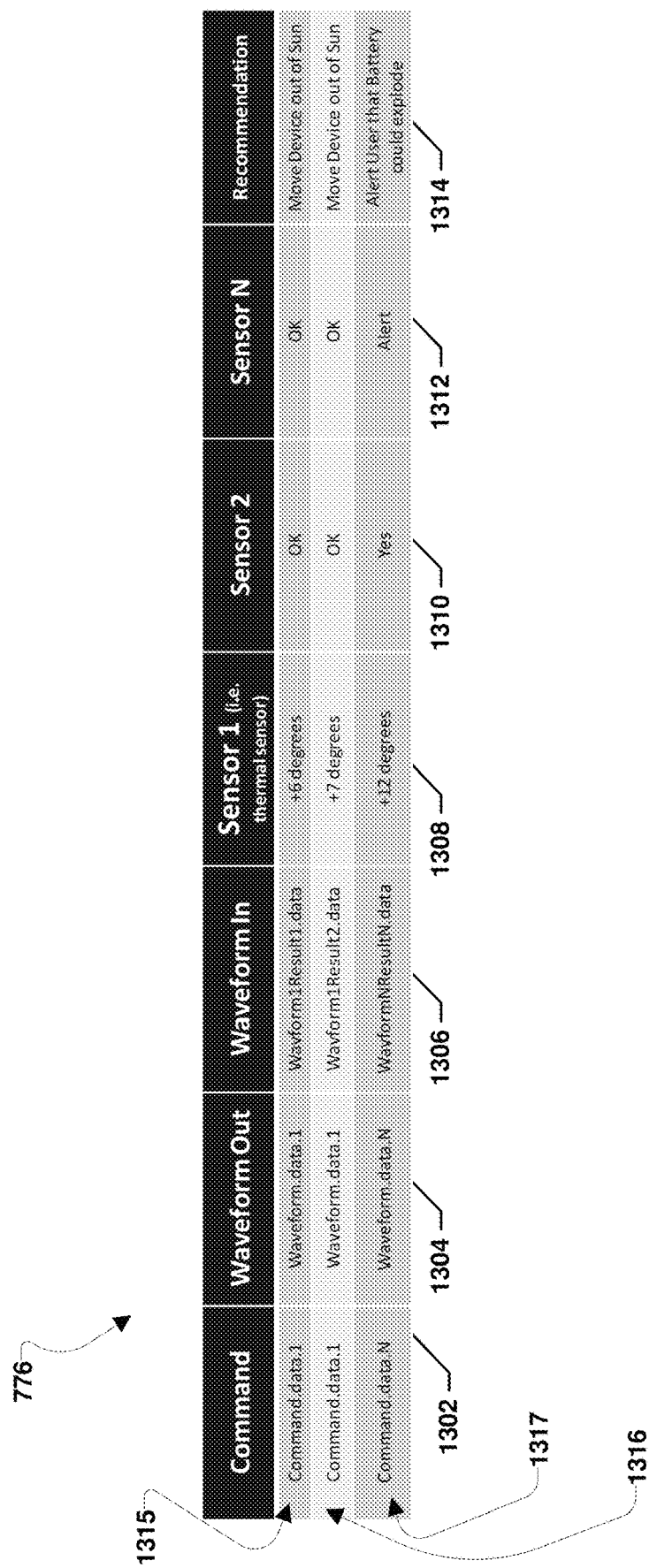
FIG. 13 is a table illustrating an example device response database.

FIG. 13 is a table illustrating the device response database 776 which may include combinations of EIS test data values and battery sensor data values for outside normal (or expected or preferred) range sensed values along with associated recommendations that may be displayed on a GUI. The values in the table of FIG. 13 may be learned from various tests on real-life batteries or may be prescribed by device and/or battery manufacturers. FIG. 13 illustrates various data entries of the device response database 776, such as data entry 1315, data entry 1316, and data entry 1317. The data entries 1315, 1316, and 1318 may each include various columns 1302-1314 of data. Column one 1302 may store the commands data that may be run to test the battery 742 associated with the device 744. Column two 1304 may store the test waveform that may be output to the battery 742 via tester 716. Column three 1306 may store the response waveform result that may be obtained for the test input (e.g., the test waveform) and commands. Column four 1308 may store the data from thermal sensor 782. For example, data stored in column four 1308 may indicate how much the temperature may be measured to be beyond the normal (or expected or preferred) operating range. Column five 1310 may store the chemical sensor 784 values. As an example, some values stored in column five 1310 may indicate the absence of a chemical, such as the entry "Ok" in data entry 1315, while a presence of that chemical may be a non-normal (or non-expected or non-preferred) condition indicated by an entry, such as the entry "Yes" in data entry 1317 or an indication of the identifier of the chemical detected. Column six 1312 may store the output of sensor 780 positioned with the battery 742. As an example, some values stored in column six may indicate the absence of any issue with the internal portions of the battery (e.g., the internal portions are in a normal (or expected or preferred) condition), such as the entry "Ok" in data entry 1320, while a detection by the internal sensor 780 of a condition that is not normal (or non-expected or non-preferred) may be indicated by an entry, such as the entry "Alert" in data entry 1317 or an indication of the type of internal issue detected by the internal sensor 780.

While three sensor results are illustrated in FIG. 13, there may be any number of sensor data columns present in the device response database 776 corresponding to each sensor from which the EISA chip memory MEMS database 708 receives sensor data. Column seven 1314 may store the recommendations that may be provided to counter the non-normal (or non-expected or non-preferred) sensed values reported by the EISA chip control module (e.g., EISA chip control module 712). For example, the recommendations may be messages indicating "Move Device Out Of Sun", "Alert User That Battery Could Explode", or any other message.

With reference to FIGS. 1-13, various embodiments may include a microelectromechanical system (MEMS) (760) comprising: an electrochemical impedance spectroscopy analyzer (EISA) chip (702) configured to perform electrochemical impedance spectroscopy ("EIS") tests on a battery (742) connected to the MEMS (760); and a first senor (780, 782, or 784) configured to gather a first type of sensor data associated with the battery (742) and provide the first type of sensor data to the EISA chip (702). In various embodiments, the MEMS (760) further comprises: a second senor (780, 782, or 784) configured to gather a second type of sensor data associated with the battery (742) and provide the second type of sensor data to the EISA chip (702); and a third sensor (780, 782, or 784) configured to gather a third type of sensor data associated with the battery (742) and provide the third type of sensor data to the EISA chip (702). In various embodiments, the first sensor is positioned within the battery, the second sensor is a thermal sensor, and the third sensor is a chemical sensor. In various embodiments, the MEMS (760) further comprises power electronics (762) configured to connect the EISA chip (702) to the battery (742) when the battery (742) is connected to the MEMS (760). In various embodiments, the power electronics (762) are disposed on the MEMS (760) such that the power electronics (762) are between the EISA chip (702) and the battery (742) when the battery (742) is connected to the MEMS (760). In various embodiments, the EISA chip (702) comprises: a tester (716); an analog-to-digital converter (714) in communication with the tester (716) and the first sensor (780, 782, or 784); and a control module (712) running on a controller (710) of the EISA chip (702) in communication with the tester (716) and the analog-to-digital converter (714). In various embodiments, the MEMS (760) further comprises: a memory (764) storing an EISA chip memory MEMS database (708) and an EISA chip memory sensor range database (766), the memory (764) in communication with the control module (712), wherein the control module (712) is configured to: control the tester (716) to run an EIS test on the battery (742) using at least one test waveform; receive, from the analog-to-digital converter (714), a response waveform result from running the EIS test on the battery (742) using the at least one test waveform; store the response waveform result in a data entry of the EISA chip memory MEMS database (708); receive, from the analog-to-digital converter (714), the first type of sensor data associated with the battery (742); and store the first type of sensor data associated with the battery (742) in the data entry of the EISA chip memory MEMS database (708). In various embodiments, the control module is further configured to: determine whether the first type of sensor data in the data entry of the EISA chip memory MEMS database (708) is within a range indicated in the EISA chip memory sensor range database (766); and send the data entry of the EISA chip memory MEMS database (708) to a device processor (772) in response to determining that the first type of sensor data in the data entry of the EISA chip memory MEMS database (708) is not within the range indicated in the EISA chip memory sensor range database (766).

With reference to FIGS. 1-13, various embodiments may include a device (744), comprising: a battery (742); a graphical user interface (GUI) (746); a device memory (775) storing a device response database (776); a device processor (772) coupled to the GUI and the device memory; and a microelectromechanical system (MEMS) (760) connected to the battery (742), the MEMS (760) comprising: an electrochemical impedance spectroscopy analyzer (EISA) chip (702) configured to perform electrochemical impedance spectroscopy ("EIS") tests on the battery (742); a first sensor (780, 782, or 784) configured to gather a first type of sensor data associated with the battery (742) and provide the first type of sensor data to the EISA chip (702); and a memory (764) storing an EISA chip memory MEMS database (708), the EISA chip memory MEMS database (708) including at least both a response waveform result from running an EIS test on the battery (742) and the first type of sensor data associated with the battery (742), wherein the device processor (772) is configured to: receive the data entry of the EISA chip memory MEMS database (708) from the EISA chip (702); compare the received data entry to the device response database (776) to identify a matching data entry; and display a recommendation correlated to the matching data entry from the device response database (776) in the GUI (746). In various embodiments, the MEMS (760) of the device (744) further comprises: a second sensor (780, 782, or 784) configured to gather a second type of sensor data associated with the battery (742) and provide the second type of sensor data to the EISA chip (702); and a third sensor (780, 782, or 784) configured to gather a third type of sensor data associated with the battery (742) and provide the third type of sensor data to the EISA chip (702). In various embodiments, the first sensor is positioned within the battery, the second sensor is a thermal sensor, and the third sensor is a chemical sensor. In various embodiments, the device further comprises power electronics (762) connecting the EISA chip (702) to the battery (742). In various embodiments, the power electronics (762) are disposed on the MEMS (760) such that the power electronics (762) are between the EISA chip (702) and the battery (742). In various embodiments, the EISA chip (702) comprises: a tester (716); an analog-to-digital converter (714) in communication with the tester (716) and the first sensor (780, 782, or 784); and a control module (712) running on a controller (710) of the EISA chip (702) in communication with the memory (764), the tester (716), and the analog-to-digital converter (714), wherein: the memory (764) further comprises an EISA chip memory sensor range database (766), and the control module (712) is configured to: control the tester (716) to run the EIS test on the battery (742) using at least one test waveform; receive, from the analog-to-digital converter (714), the response waveform result from running the EIS test on the battery (742) using the at least one test waveform; store the response waveform result in the data entry of the EISA chip memory MEMS database (708); receive, from the analog-to-digital converter (714), the first type of sensor data associated with the battery (742); and store the first type of sensor data associated with the battery (742) in the data entry of the EISA chip memory MEMS database (708). In various embodiments, the control module (712) is further configured to: determine whether the first type of sensor data in the data entry of the EISA chip memory MEMS database (708) is within a range indicated in the EISA chip memory sensor range database (766); and send the data entry of the EISA chip memory MEMS database (708) to the device processor (772) in response to determining that the first type of sensor data in the data entry of the EISA chip memory MEMS database (708) is not within the range indicated in the EISA chip memory sensor range database (766). In various embodiments, the device (744) further comprises: a device sensor (768), wherein the control module (712) is configured to control the tester (716) to run the EIS test on the battery (742) using at least one test waveform in response to the device sensor (768) being triggered. In various embodiments, the device processor (772) is further configured to adjust the device (744) or the device sensor (768) based on the recommendation correlated to the matching data entry from the device response database (776).

With reference to FIGS. 1-13, various embodiments include a method for electrochemical impedance spectroscopy ("EIS") testing of a battery (742), comprising: performing an electrochemical impedance spectroscopy ("EIS") test on the battery (742) by an electrochemical impedance spectroscopy analyzer (EISA) chip (702) of a microelectromechanical system (MEMS) (760) connected to the battery (742); storing a response waveform result from running the EIS test on the battery (742) in a data entry of an EISA chip memory MEMS database (708) of the EISA chip (702); receiving a first type of sensor data associated with the battery (742) from a first senor (780, 782, or 784); storing the first type of sensor data associated with the battery (742) in the data entry of the EISA chip memory MEMS database (708); determining whether the first type of sensor data in the data entry of the EISA chip memory MEMS database (708) is within a range indicated in an EISA chip memory sensor range database (766) of the EISA chip (702); and sending the data entry of the EISA chip memory MEMS database (708) to a device processor (772) in response to determining that the first type of sensor data in the data entry of the EISA chip memory MEMS database (708) is not within the range indicated in the EISA chip memory sensor range database (766). In various embodiments, the method may further comprise receiving, in the device processor (772), the data entry of the EISA chip memory MEMS database (708); comparing, by the device processor (772), the received data entry to a device response database (776) to identify a matching data entry; and displaying, by the device processor (772), a recommendation correlated to the matching data entry from the device response database (776) in a graphical user interface (GUI) (746) of the device (744). In various embodiments, the EIS test on the battery (742) is performed in response to a device sensor (768) being triggered.

The foregoing method descriptions and diagrams are provided merely as illustrative examples and are not intended to require or imply that the steps of the various embodiments must be performed in the order presented. As will be appreciated by one of skill in the art the order of steps in the foregoing embodiments may be performed in any order. Further, words such as "thereafter," "then," "next," etc. are not intended to limit the order of the steps; these words are simply used to guide the reader through the description of the methods.

One or more diagrams have been used to describe exemplary embodiments. The use of diagrams is not meant to be limiting with respect to the order of operations performed. The foregoing description of exemplary embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

Control elements may be implemented using computing devices (such as computer) comprising processors, memory and other components that have been programmed with instructions to perform specific functions or may be implemented in processors designed to perform the specified functions. A processor may be any programmable microprocessor, microcomputer or multiple processor chip or chips that can be configured by software instructions (applications) to perform a variety of functions, including the functions of the various embodiments described herein. In some computing devices, multiple processors may be provided. Typically, software applications may be stored in the internal memory before they are accessed and loaded into the processor. In some computing devices, the processor may include internal memory sufficient to store the application software instructions.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

The preceding description of the disclosed embodiments is provided to enable any person skilled in the art to make or use the described embodiment. Various modifications to these embodiments will be readily apparent to those skilled in the art, and the generic principles defined herein may be applied to other embodiments without departing from the scope of the disclosure. Thus, the present invention is not intended to be limited to the embodiments shown herein but is to be accorded the widest scope consistent with the following claims and the principles and novel features disclosed herein.

What is claimed is:

1. A microelectromechanical system (MEMS), comprising:
    an electrochemical impedance spectroscopy analyzer (EISA) chip configured to perform electrochemical impedance spectroscopy (EIS) tests on a battery connected to the MEMS, the EISA chip including:
        a tester configured to run an EIS test on the battery using at least one test waveform; and
        an analog-to-digital converter in communication with the tester; and
        power electronics configured to connect the tester to the battery when the battery is connected to the MEMS; and
    a first sensor connected to the battery and the analog-to-digital converter, the first sensor configured to gather a first type of sensor data associated with the battery and provide the first type of sensor data to the analog-to-digital converter.

2. The MEMS of claim 1, further comprising:
    a second sensor connected to the battery and the analog-to-digital converter, the second sensor configured to gather a second type of sensor data associated with the battery and provide the second type of sensor data to the analog-to-digital converter; and
    a third sensor connected to the battery and the analog-to-digital converter, the third sensor configured to gather a third type of sensor data associated with the battery and provide the third type of sensor data to the analog-to-digital converter.

3. The MEMS of claim 2, wherein the first sensor is positioned within the battery, the second sensor is a thermal sensor, and the third sensor is a chemical sensor.

4. The MEMS of claim 1, wherein the EISA chip further comprises:
    a control module running on a controller of the EISA chip in communication with the tester and the analog-to-digital converter.

5. The MEMS of claim 4, further comprising:
    a memory storing an EISA chip memory MEMS database and an EISA chip memory sensor range database, the memory in communication with the control module,
    wherein the control module is configured to:
        control the tester to run the EIS test on the battery using the at least one test waveform;
        receive, from the analog-to-digital converter, a response waveform result from running the EIS test on the battery using the at least one test waveform;
        store the response waveform result in a data entry of the EISA chip memory MEMS database;
        receive, from the analog-to-digital converter, the first type of sensor data associated with the battery; and
        store the first type of sensor data associated with the battery in the data entry of the EISA chip memory MEMS database.

6. The MEMS of claim 5, wherein the control module is further configured to:
    determine whether the first type of sensor data in the data entry of the EISA chip memory MEMS database is within a range indicated in the EISA chip memory sensor range database; and
    send the data entry of the EISA chip memory MEMS database to a device processor in response to determining that the first type of sensor data in the data entry of the EISA chip memory MEMS database is not within the range indicated in the EISA chip memory sensor range database.

7. A device, comprising:
    a battery;
    a graphical user interface (GUI);
    a device memory storing a device response database;
    a device processor coupled to the GUI and the device memory; and
    a microelectromechanical system (MEMS) connected to the battery and coupled to the device processor, the MEMS comprising:

an electrochemical impedance spectroscopy analyzer (EISA) chip configured to perform electrochemical impedance spectroscopy ("EIS") tests on the battery, the EISA chip including:
  a tester configured to run an EIS test on the battery using at least one test waveform; and
  an analog-to-digital converter in communication with the tester; and
  power electronics configured to connect the tester to the battery when the battery is connected to the MEMS;
a first sensor connected to the battery and the analog-to-digital converter, the first sensor configured to gather a first type of sensor data associated with the battery and provide the first type of sensor data to the analog-to-digital converter; and
a memory storing an EISA chip memory MEMS database, the EISA chip memory MEMS database including at least both a response waveform result from running the EIS test on battery and the first type of sensor data associated with the battery, wherein the device processor is configured to:
receive the data entry of the EISA chip memory MEMS database from the EISA chip;
compare the received data entry to the device response database to identify a matching data entry; and
display a recommendation correlated to the matching data entry from the device response database in the GUI.

8. The device of claim 7, wherein the MEMS further comprises:
a second sensor connected to the battery and the analog-to-digital converter, the second sensor configured to gather a second type of sensor data associated with the battery and provide the second type of sensor data to the analog-to-digital converter; and
a third sensor connected to the battery and the analog-to-digital converter, the third sensor configured to gather a third type of sensor data associated with the battery and provide the third type of sensor data to analog-to-digital converter.

9. The device of claim 8, wherein the first sensor is positioned within the battery, the second sensor is a thermal sensor, and the third sensor is a chemical sensor.

10. The device of claim 7, wherein the EISA chip further comprises:
a control module running on a controller of the EISA chip in communication with the memory, the tester, and the analog-to-digital converter,
wherein:
  the memory further comprises an EISA chip memory sensor range database, and
  the control module is configured to:
    control the tester to run the EIS test on the battery using the at least one test waveform;
    receive, from the analog-to-digital converter, the response waveform result from running the EIS test on the battery using the at least one test waveform;
    store the response waveform result in the data entry of the EISA chip memory MEMS database;
    receive, from the analog-to-digital converter, the first type of sensor data associated with the battery; and
    store the first type of sensor data associated with the battery in the data entry of the EISA chip memory MEMS database.

11. The device of claim 10, wherein the control module is further configured to:
determine whether the first type of sensor data in the data entry of the EISA chip memory MEMS database is within a range indicated in the EISA chip memory sensor range database; and
send the data entry of the EISA chip memory MEMS database to the device processor in response to determining that the first type of sensor data in the data entry of the EISA chip memory MEMS database is not within the range indicated in the EISA chip memory sensor range database.

12. The device of claim 10, further comprising:
a device sensor,
wherein the control module is configured to control the tester to run the EIS test on the battery in response to the device sensor being triggered.

13. The device of claim 12, wherein the device processor is further configured to adjust the device or the device sensor based on the recommendation correlated to the matching data entry from the device response database.

14. A method for electrochemical impedance spectroscopy (EIS) testing of a battery, comprising:
performing an EIS test on the battery by an electrochemical impedance spectroscopy analyzer (EISA) chip of a microelectromechanical system (MEMS) connected to the battery at least in part using power electronics connecting a tester of the EIS chip configured to apply at least one test waveform to the battery, the EISA chip including an analog-to-digital converter in communication with the tester;
storing a response waveform result from running the EIS test on the battery in a data entry of an EISA chip memory MEMS database of the EISA chip;
receiving, from the analog-to-digital converter, a first type of sensor data associated with the battery from a first sensor connected to the battery and the analog-to-digital converter;
storing the first type of sensor data associated with the battery in the data entry of the EISA chip memory MEMS database;
determining whether the first type of sensor data in the data entry of the EISA chip memory MEMS database is within a range indicated in an EISA chip memory sensor range database of the EISA chip; and
sending the data entry of the EISA chip memory MEMS database to a device processor in response to determining that the first type of sensor data in the data entry of the EISA chip memory MEMS database is not within the range indicated in the EISA chip memory sensor range database.

15. The method of claim 14, further comprising:
receiving, in the device processor, the data entry of the EISA chip memory MEMS database;
comparing, by the device processor, the received data entry to a device response database to identify a matching data entry; and
displaying, by the device processor, a recommendation correlated to the matching data entry from the device response database in a graphical user interface (GUI) of the device.

16. The method of claim 15, wherein the EIS test on the battery is performed in response to a device sensor being triggered.

* * * * *